United States Patent
Shelnutt et al.

(10) Patent No.: US 9,968,010 B2
(45) Date of Patent: *May 8, 2018

(54) INFORMATION HANDLING SYSTEM HAVING FLEXIBLE CHASSIS BLOCK RADIATORS

(71) Applicant: DELL PRODUCTS, L.P., Round Rock, TX (US)

(72) Inventors: Austin Michael Shelnutt, Leander, TX (US); Edmond I. Bailey, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 78 days.

This patent is subject to a terminal disclaimer.

(21) Appl. No.: 15/017,607

(22) Filed: Feb. 6, 2016

(65) Prior Publication Data

US 2017/0181325 A1   Jun. 22, 2017

Related U.S. Application Data

(60) Provisional application No. 62/272,055, filed on Dec. 28, 2015, provisional application No. 62/270,563, filed on Dec. 21, 2015.

(51) Int. Cl.
H05K 7/20 (2006.01)

(52) U.S. Cl.
CPC ....... *H05K 7/20781* (2013.01); *H05K 7/2039* (2013.01); *H05K 7/20272* (2013.01); *H05K 7/20736* (2013.01)

(58) Field of Classification Search
CPC .......... H05K 7/20781; H05K 7/20636; H05K 7/20645; H05K 7/20772
See application file for complete search history.

(56) References Cited

U.S. PATENT DOCUMENTS

| | | | |
|---|---|---|---|
| 7,134,486 B2 | 11/2006 | Santiago et al. | |
| 7,599,184 B2 | 10/2009 | Upadhya et al. | |
| 7,637,312 B1 | 12/2009 | Heydari | |
| 7,660,109 B2* | 2/2010 | Iyengar | H05K 7/20754 165/104.33 |
| 7,724,524 B1* | 5/2010 | Campbell | H05K 7/20772 165/104.19 |
| 7,916,483 B2* | 3/2011 | Campbell | H05K 7/20236 165/80.4 |

(Continued)

*Primary Examiner* — David M Sinclair
*Assistant Examiner* — Robert Brown
(74) *Attorney, Agent, or Firm* — Isidore PLLC

(57) ABSTRACT

A liquid handling (LH) block of an Information Handling System (IHS) having a first transfer conduit having node-receiving intake port/s sealably engaged for fluid transfer to node intake port/s of Liquid Cooled (LC) node/s and having supply connection/s. A second transfer conduit has node-receiving outlet port/s sealably engaged for fluid transfer to LC node output port/s of the LC node/s and having return connection/s. A radiator includes a portion of the second transfer conduit. A cooling liquid distribution subsystem has a user selectable first and second sets of liquid conduits connectable to the module in one of an open-loop configuration utilizing facility supplied cooling liquid and a closed-loop configuration to recirculate cooling liquid between the block radiator and the node-level system of conduits.

17 Claims, 18 Drawing Sheets

(56) References Cited

U.S. PATENT DOCUMENTS

| | | |
|---|---|---|
| 8,405,975 B2 | 3/2013 | Helberg et al. |
| 8,453,467 B2 | 6/2013 | Hood, III et al. |
| 9,529,395 B2* | 12/2016 | Franz ................. H05K 7/20772 |
| 2008/0087024 A1 | 4/2008 | Hood et al. |
| 2010/0103614 A1* | 4/2010 | Campbell .......... H05K 7/20809 |
| | | 361/689 |
| 2010/0103618 A1* | 4/2010 | Campbell .......... H05K 7/20772 |
| | | 361/699 |
| 2013/0106265 A1* | 5/2013 | Shelnutt ............. H05K 7/20254 |
| | | 312/236 |
| 2013/0112378 A1* | 5/2013 | Shelnutt ............. H05K 7/20781 |
| | | 165/121 |
| 2014/0085821 A1* | 3/2014 | Regimbal .......... H05K 7/20236 |
| | | 361/699 |
| 2014/0202678 A1* | 7/2014 | Goth .................. H05K 7/20772 |
| | | 165/287 |
| 2015/0138722 A1 | 5/2015 | French, Jr. et al. |
| 2016/0366792 A1* | 12/2016 | Smith ....................... G06F 1/20 |
| 2017/0049009 A1* | 2/2017 | Steinke ............. H05K 7/20781 |

\* cited by examiner

INFORMATION HANDLING SYSTEM HAVING FLEXIBLE CHASSIS BLOCK RADIATORS

PRIORITY

The present invention claims priority from each of the following provisional patent applications, with relevant content of each listed provisional application incorporated herein by reference: Provisional Application Ser. No. 62/270,563, with filing date Dec. 21, 2015; and Provisional Application Ser. No. 62/272,055, with filing date Dec. 28, 2015.

BACKGROUND

1. Technical Field

The present disclosure generally relates to information handling systems (IHS), and more particular to removing heat from a rack-based IHS using block radiators.

2. Description of the Related Art

As the value and use of information continue to increase, individuals and businesses seek additional ways to process and store information. One option available to users is an Information Handling System (IHS). An IHS generally processes, compiles, stores, and/or communicates information or data for business, personal, or other purposes, thereby allowing users to take advantage of the value of the information. Technology and information handling needs and requirements vary between different users or applications. IHSs may vary regarding what information is handled, how the information is handled, how much information is processed, stored, or communicated, as well as how quickly and efficiently the information is processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

For implementations requiring a large amount of processing capability, a rack-configured (or rack) IHS (RIHS) can be provided. The RIHS includes a physical rack, within which is inserted a plurality of functional nodes, such as server (or processing) nodes/modules, storage nodes, and power supply nodes. These nodes, and particularly the server nodes, typically include processors and other functional components that dissipate heat when operating and/or when connected to a power supply. Efficient removal of the heat being generated by these components is required to maintain the operational integrity of the RIHS. Traditional heat removal systems include use of air movers, such as fans, to convectionally transfer the heat from inside of the RIHS to outside the RIHS. More recently, some RIHS have been designed to enable submersion of the server modules and/or the heat generating components in a tank of cooling liquid to effect cooling via absorption of the heat by the surrounding immersion liquid.

The amount of processing capacity and storage capacity per node and/or per rack continues to increase, providing greater heat dissipation per node and requiring more directed cooling solutions. Extreme variations can exist in server/power/network topology configurations within an IT rack. In addition to dimension variations, the thermal requirements for heat-generating functional components for power, control, storage and server nodes can be very different between types or vary according to usage. These variations drive corresponding extreme diversity in port placement, fitting size requirements, mounting locations, and manifold capacity for a liquid cooling subsystem. Further, a chassis of each node is typically densely provisioned. Lack of space thus exists to mount a discrete water distribution manifold in high-power IT racks.

Thus, there is a continuing need for further innovations to provide directed cooling for the individual heat generating components, both at the individual node level, as well as at the larger rack level. When designing the cooling subsystem, consideration must also be given to the different form factors of IT nodes and rack heights of the RIHS, and the ability to effectively control cooling discretely (at device or node level) and generally across the overall RIHS.

As liquid cooling improves in efficiencies and performance, data center solutions continue to focus on implementing liquid cooling at the rack level for all components within the nodes.

BRIEF SUMMARY

The illustrative embodiments of the present disclosure provides a liquid handling (LH) block for use in a Direct-Interface Liquid Cooled (LC) Rack Information Handling System (RIHS) having at least one LC node with heat generating components. In one or more embodiments the LH block includes a radiator having a first transfer conduit having a node-receiving intake port that enables sealable engagement for fluid transfer to at least one node intake port of at least one LC node and has at least one supply connection. The LH block includes a second transfer conduit having a node-receiving outlet port that enables sealable engagement for fluid transfer to at least one node output port of the at least one LC node and having at least one return connection. The LH block includes a liquid-to-air heat exchanger (LTAHE), or radiator, that is a portion of the second transfer conduit. A cooling liquid distribution subsystem includes a user selectable first set of liquid conduits connectable to one of the at least one supply connection to receive a flow of cooling liquid from a liquid supply. The first set is connectable to one of the at least one return connection to return the flow of cooling liquid to a liquid return to form an open-loop configuration to absorb and transfer heat from the at least one LC node. The cooling liquid distribution subsystem includes a user selectable second set of liquid conduits connectable between the at least one supply connection and the at least one return connection of the block radiator to form a closed-loop configuration to recirculate cooling liquid between the LH block and the node-level system of conduits. The at least one LC node includes a node enclosure provisioned with at least one heat-generating component. The node enclosure is provisioned with an internal node-level liquid cooling system of conduits comprising at least one node supply conduit connected for fluid transfer to the at least one node intake port and at least one node return conduit connected for fluid transfer to the at least one node output port.

According to one aspect, the present disclosure provides an Information Handling System (IHS) includes at least one LC node having a node enclosure. The node enclosure is provisioned with at least one heat-generating component. The node enclosure is provisioned with an internal node-level liquid cooling system of conduits comprising at least one node supply conduit connected for fluid transfer to the at least one LC node intake port and at least one node return conduit connected for fluid transfer to the at least one node output port. A LH block includes a first transfer conduit having at least one node-receiving intake port sealably engaged for fluid transfer to the at least one node intake port of the at least one LC node and having at least one supply connection. The LH block includes a second transfer conduit having at least one node-receiving outlet port sealably engaged for fluid transfer to at least one node output port of the at least one LC node and having at least one return connection. The LH blocks includes an LTAHE that is a portion of the second transfer conduit. A cooling liquid distribution subsystem includes a user selectable first set of liquid conduits connectable to one of the at least one supply connection to receive a flow of cooling liquid from a liquid supply. The first set is connectable to one of the at least one return connection to return the flow of cooling liquid to a liquid return forming an open-loop configuration to absorb and transfer heat from the at least one LC node. The cooling liquid distribution subsystem includes a user selectable second set of liquid conduits. The second set is connectable between the at least one supply connection and the at least one return connection of the block radiator to form a closed-loop configuration to recirculate cooling liquid between the block radiator and the node-level system of conduits.

According to one aspect, a method is provided for a method of assembling an IHS. In one or more embodiments, the method includes positioning a LH block in a rear section of a rack. The LH block includes the afore-mentioned radiator. The method includes inserting into a node-receiving bay of the rack at least one LC node comprising a node enclosure provisioned with at least one heat-generating component and an internal node-level liquid cooling system of conduits comprising at least one node supply conduit connected for fluid transfer to the at least one node intake port and at least one node return conduit connected for fluid transfer to the at least one node output port. The method includes determining whether the at least one LC node comprises a fluid mover connected to the node-level liquid cooling system of conduits to move the cooling liquid through the LTAHE in a closed-loop configuration. In response to determining that the at least one LC node does not a comprise a fluid mover, the method includes attaching a user selectable first set of liquid conduits of a cooling liquid distribution subsystem connectable to one of the at least one supply connection to receive a flow of cooling liquid from a liquid supply. The first set is also connectable to one of the at least one return connection to return the flow of cooling liquid to a liquid return forming an open-loop configuration to absorb and transfer heat from the at least one LC node. In response to determining that the at least one LC node does not a comprise a fluid mover, the method includes attaching a user selectable second set of liquid conduits of the cooling liquid distribution subsystem connectable between the at least one supply connection and the at least one return connection of the block radiator. The second set forms a closed-loop configuration to recirculate cooling liquid between the block radiator and the node-level system of conduits.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1A:
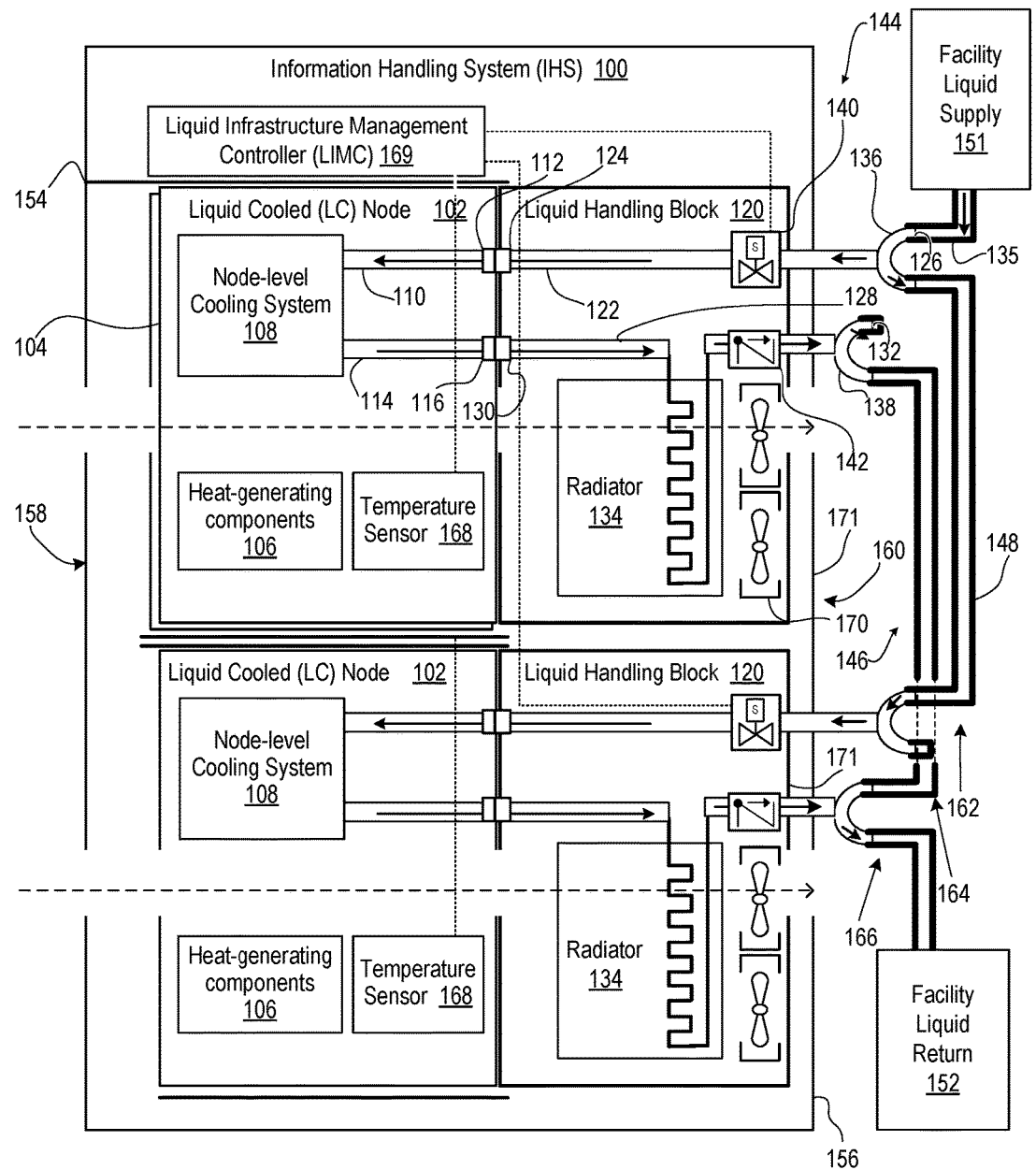
FIG. 1A illustrates a side perspective view of an internal layout/configuration of an example Information Handling System (IHS) having a liquid handling (LH) block that is configured for open-loop serial liquid circulation and open-loop air exhaust for a Liquid-Cooled (LC) node, according to one or more embodiments.

The illustrative embodiments provide a liquid handling (LH) block of an Information Handling System (IHS) having a radiator that includes a first transfer conduit having node-receiving intake port/s sealably engaged for fluid transfer to node intake port/s of Liquid Cooled (LC) node/s and having supply connection/s. A second transfer conduit has node-receiving outlet port/s sealably engaged for fluid transfer to LC node output port/s of the LC node/s and having return connection/s. A liquid-to-air heat exchanger, or radiator, includes a portion of the second transfer conduit. A cooling liquid distribution subsystem has a user selectable first and second sets of liquid conduits connectable to the module in one of an open-loop configuration utilizing facility supplied cooling liquid and a closed-loop configuration to recirculate cooling liquid between the block radiator and the node-level system of conduits.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

As utilized herein, the term "rack-configured" (as in RIHS) generally refers to the configuration of a large scale sever system within a physical rack having multiple chassis receiving rails for receiving specific sizes of information technology (IT) nodes, such as server modules, storage modules, and power modules. The term node generally refers to each separate unit inserted into a 1U or other height rack space within the rack. In one embodiment, operational characteristics of the various IT nodes can be collectively controlled by a single rack-level controller. However, in the illustrated embodiments, multiple nodes can be arranged into blocks, with each block having a separate block-level controller that is communicatively connected to the rack-level controller.

For purposes of this disclosure, an information handling system (defined at the individual server level) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

As illustrated by the figures and described herein, multiple processing servers or server IHSs (referred to herein as server nodes) can be included within the single RIHS. Certain aspects of the disclosure then relate to the specific LC (sever or other) nodes and the functionality associated with these individual nodes or block-level groupings of nodes, while other aspects more generally relate to the overall LRC RIHS containing all of the LC nodes.

As one design detail/aspect for the present innovation, consideration is given to the fact that extreme variations can exist in server/power/network topology configurations within an IT rack. In addition to dimension variations, the thermal requirements for heat-generating functional components for power, control, storage and server nodes can be very different between types or vary according to usage. The present disclosure addresses and overcomes the challenges with distributing liquid cooling fluids throughout an IT rack having nodes with a large number of variations in distribution components.

In addition to direct-interfacing of liquid cooling to the primary heat generating components of the rack such as the processor, the present disclosure also includes additional consideration for cooling of secondary equipment and auxiliary components within the rack utilizing fluid-to-fluid heat exchanger methodology. Additionally, the present disclosure provides a modular approach to utilizing an air-to-liquid heat exchanger with quick connection and scalability to allow the solution to be scalable in both 1U and 2U increments.

FIG. 1A illustrates an Information Handling System (IHS) 100*a* that includes liquid cooled (LC) nodes 102 includes a node enclosure 104 each provisioned with heat-generating components 106. The node enclosure 104 is provisioned an internal node-level liquid cooling system 108 of conduits. The system 108 that includes node supply conduit/s 110 connected for fluid transfer to LC node intake port/s 112. The system 108 includes node return conduit/s 114 connected for fluid transfer to node output port/s 116.

A liquid handling block 120 includes a first transfer conduit 122 having node-receiving input port/s 124. Node intake port/s 112 of the LC node 102 sealably engaged for fluid transfer to the node-receiving input port/s 124 of the liquid handling block 120. The first transfer conduit 122 has supply connection/s 126. The liquid handling block 120 includes a second transfer conduit 128 having node-receiving outlet port/s 130 sealably engaged for fluid transfer to node output port/s 116 of the LC node 102. The second transfer conduit 128 has return connection/s 132. The liquid handling block 120 has an liquid-to-air heat exchanger 134 that forms a portion of the second transfer conduit 130. In the present disclosure, the liquid-to-air heat exchanger 134 is referred to as radiator 134 or block radiator 134. Radiator 134 performs heat transfer functions, similar to a liquid-based radiator, utilized for cooling IT nodes placed within a block chassis juxtaposed in front of the liquid handling block.

In an exemplary embodiment, the first transfer conduit 122 of the liquid handling block 120 includes a supply bypass tube 136 terminating in the two supply connections 126. The second transfer conduit 128 of the liquid handling block 120 includes a return bypass tube 138 terminating in two return connections 132. A dynamic control valve 140 directs a portion of cooling liquid from the supply bypass tube 136 to the node-receiving input port/s 124. A check valve 142 allows forward flow only of the cooling liquid that has absorbed heat from the heat-generating component/s 106 from the LC node 102 and the liquid handling block 120 back to return bypass tube 138.

A cooling liquid distribution subsystem 144 has a user-selectable first set 146 of liquid conduits, and more particularly a Modular Liquid Distribution (MLD) conduits 148. The first set 146 is connectable to one of the supply connection/s 126 to receive a flow of cooling liquid from a facility liquid supply 151. The first set 146 is also connectable to the return connection/s 132 to return the flow of cooling liquid to a facility liquid return 152. The first set 146 forms an open-loop configuration to absorb and transfer heat from the LC node 102 into facility cooling liquid.

In one or more embodiments, one or more node 102 is received in a block chassis 154 that is mounted to, or that is integral to, a rack 156. LC node 102 can be inserted into a front bay 158 of the block chassis 154. The liquid handling block 120 can be received in a rear section 160 of the rack 156. MLD conduits 148 can connect supply connections 128 to form a supply conduit 162. Other MLD conduits 148 can connect return connections 132 in adjacent LC nodes 102 to form a return conduit 164 of a liquid rail 166. The dynamic control valve 140 is positioned to dynamically regulate liquid flow through the first transfer conduit 122 of the block radiator 118. Sensor/s 168 that detect intake, internal or exhausted temperatures, moisture levels, or liquid pressure are positioned to detect a temperature within the LC node 102. A liquid infrastructure management controller (LIMC) 169 is in communication with the sensor/s 168 and the dynamic control valve 140 to control an amount of liquid flow in response to the temperature detected by the sensor/s 168.

An air mover 170 can be integral to, attached to, or optionally positioned remote from the LH block 120 to move air through the radiator 134. In one or more embodiments, the LH block 120 provides mounting provisions for the air mover/s 170 to form an LH block assembly 171. For example, other components in the node 102 can be cooled by exhaust air passing through the node enclosure 104. The heat absorbed and transferred by the exhaust air can in turn be absorbed and transferred by the cooling liquid passing through the radiator 134. In one or more embodiments, any air mover 170 can be turned off or not installed so that heat absorbed by the cooling liquid within the node 102 is returned to the facility liquid return 152 without being transferred to ambient air within the facility.

Figure 1B:
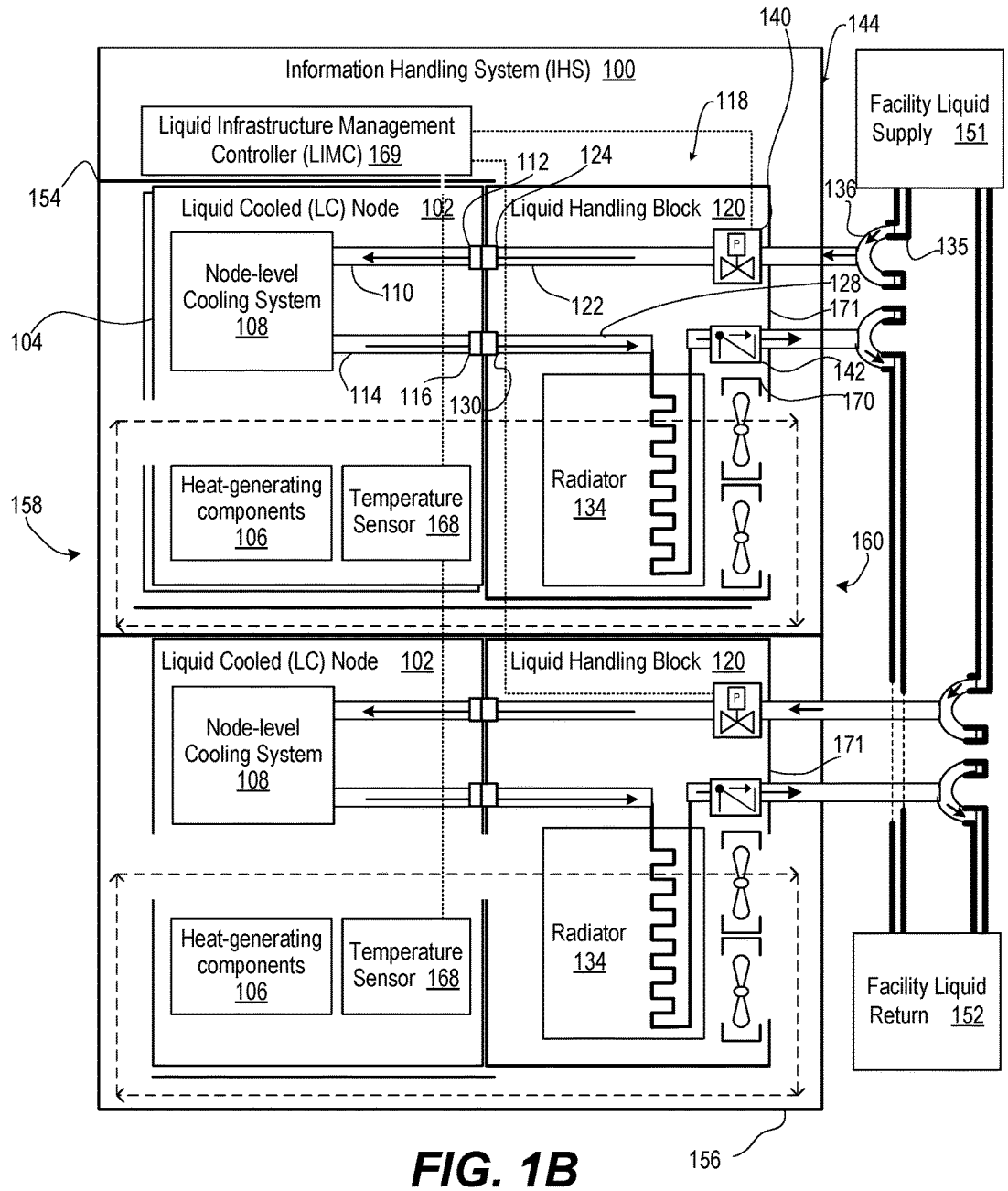
FIG. 1B illustrates a side perspective view of an internal layout/configuration of an example IHS having a LH block that is configured for open-loop parallel liquid circulation with closed-loop air circulation for an LC node, according to one or more embodiments.

FIG. 1B illustrates an IHS 100*b* that is similar to the IHS 100*a* (FIG. 1A), but configured with parallel open-loop liquid circulation instead of serial supply and serial return paths to each LC node 102. Each LC node 102 has a dedicated supply conduit 172 and a dedicated return rail 174. FIG. 1B further illustrates a closed-loop air circulation approach to cooling the LC nodes 102. A closed-loop air duct 176 routes air exhausted by air movers 170 back to an air intake 178 of the node enclosure 104. The radiators 134 serve as an air-to-liquid heat exchanger, absorbing and transferring heat from exhaust air into the cooling liquid. The parallel open loop liquid circulation thus transfers substantially all of the heat from the IHS 100*b* to the facility liquid return 152.

According to one embodiment, a liquid rail can includes a series of secondary conduits, such as supply and return divert conduits that provides a by-pass fluid path for each of MLD conduits 148. In operation, divert conduit allows for the removal of corresponding MLD conduit 148, thus removing the flow of cooling liquid to the particular block of nodes, without interrupting the flow of cooling liquid to the other surrounding blocks of computer gear. For example, a particular MLD conduit 148 can be replaced due to a leak. For another example, a liquid handling block 120 can be replaced. The inclusion of divert conduits, thus enables rapid servicing and maintenance of liquid handling block 120 and/or nodes within block chassis without having to reconfigure the MLD conduits 148. In addition, the RIHS 100 can continue operating as cooling liquid continues to be provided to the remainder of the blocks that are plugged into the liquid rail. Re-insertion of the MLD conduit 148 then reconnects the flow of cooling liquid to the block for normal cooling operations, and shuts off the diverted flow of cooling liquid. In an exemplary embodiment, the MLD conduits 148 provide a quick disconnect feature that interrupts flow when not fully engaged to a respective port. Disconnection of an MLD conduit 148 interrupts flow in a primary portion of the liquid rail 166 for either supply or return, shifting flow through one or more divert conduits to provide cooling liquid to the other liquid handling block 120. In one or more embodiments, a manual or active shutoff valve can interrupt flow on either or both of the primary or divert portions of the liquid rail 166.

Figure 2:
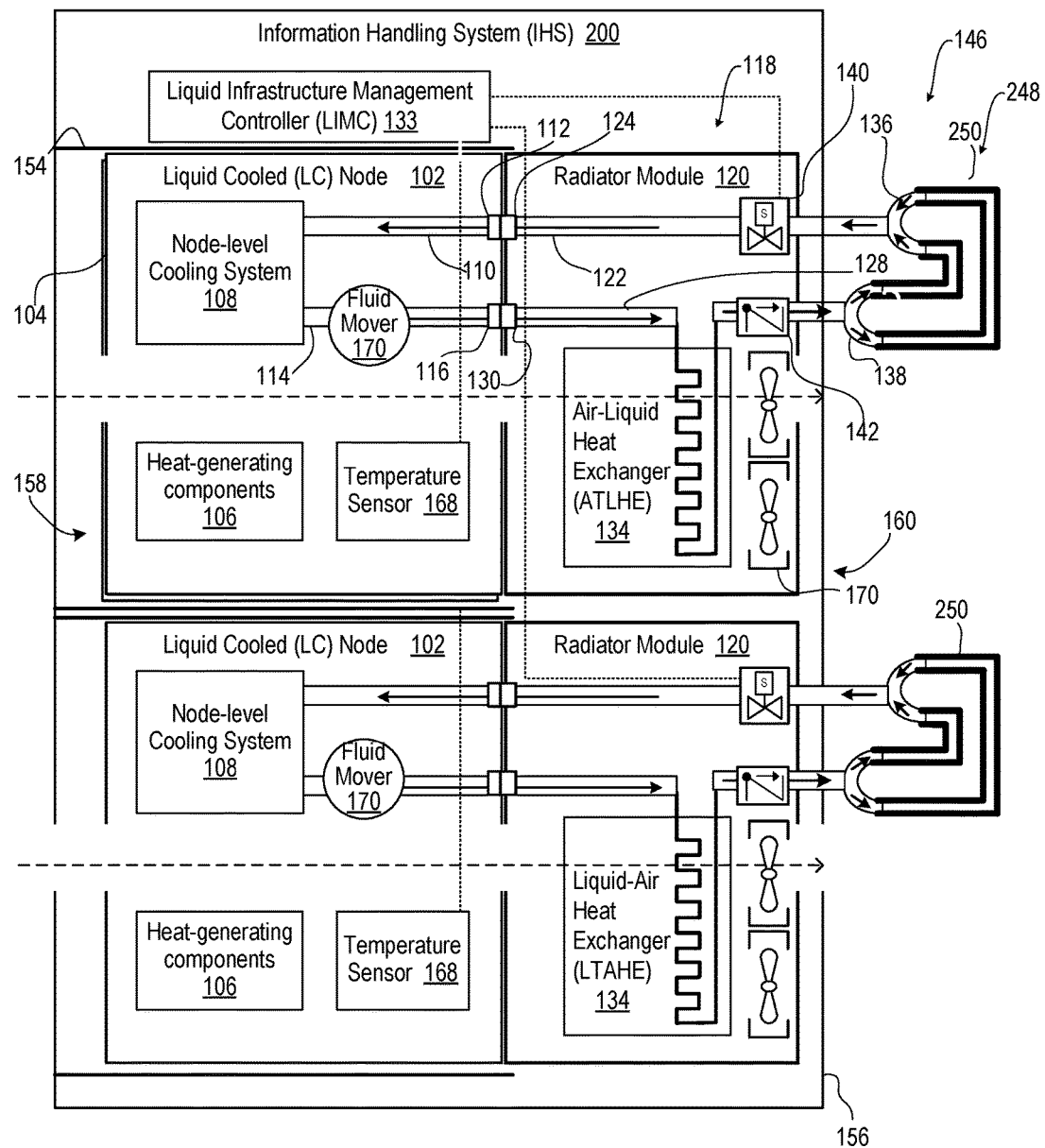
FIG. 2 illustrates a side perspective view of an internal layout/configuration of an example IHS having an air-cooled node and liquid cooled (LC) nodes, according to one or more embodiments.

FIG. 2 illustrates an IHS 200 as described above for the IHS 100a of FIG. 1A but having LC nodes 202 that include a fluid mover 203 connected to a node-level liquid cooling system 208 of conduits to enable movement of the cooling liquid through the LTAHE 134 in a closed-loop configuration. Thus, the cooling liquid distribution subsystem 144 utilizes a user-selectable second set 248 of MLD conduits 250 that are intra-node. MLD conduits 250 are connected between the pair of supply connections 126 and between the pair of return connections 132 of the block radiator 118 forming a closed-loop configuration to recirculate cooling liquid between the block radiator and the node-level system of conduits. The MLD conduits 250 and the supply and return connections 128, 133 can be quick release couplings. The air mover 170 is activated at a speed sufficient for the cooling liquid in the radiator 134 to absorb and transfer heat to air exhausted from the radiator 134.

Figure 3:
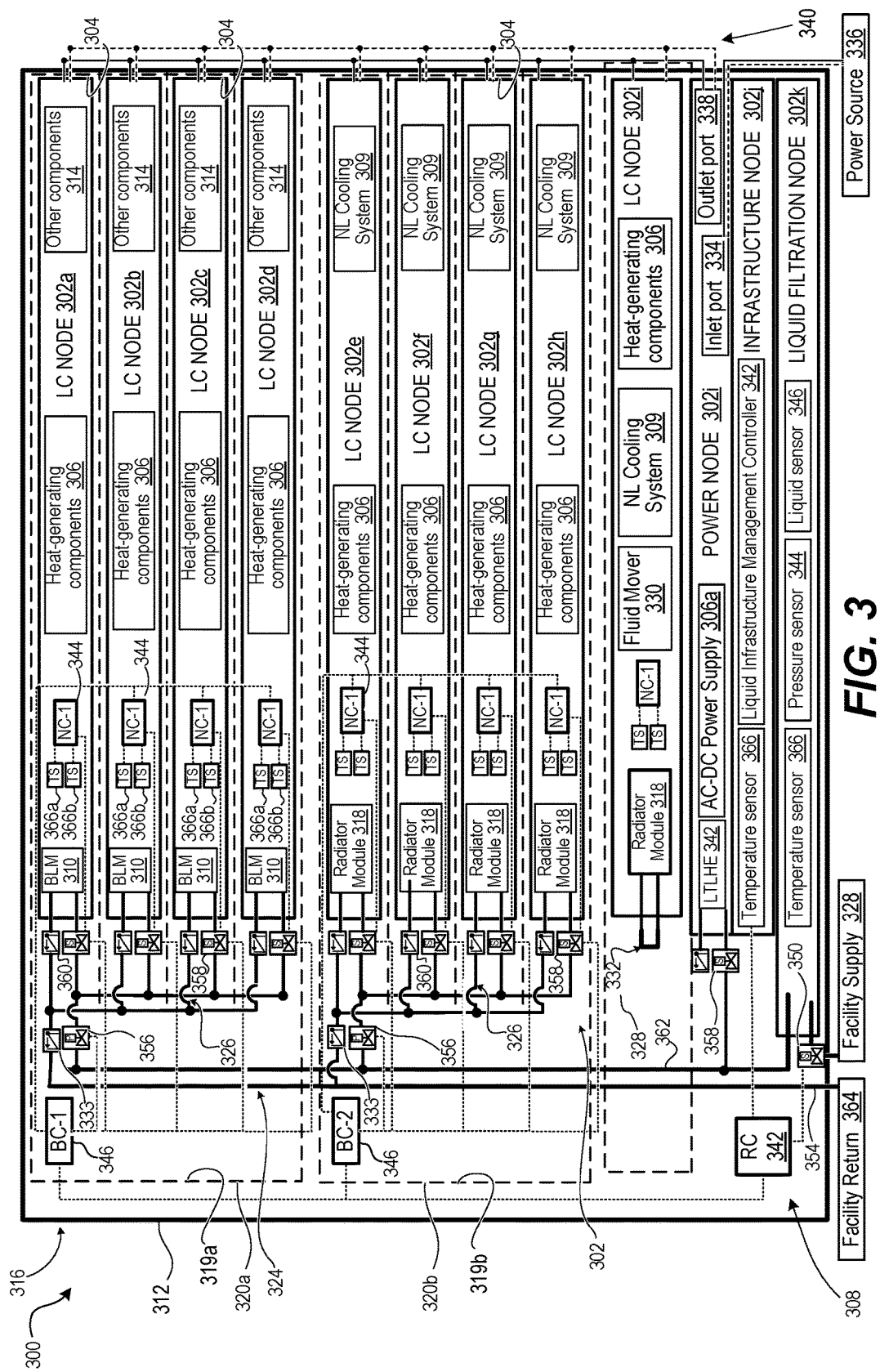
FIG. 3 illustrates a detailed block diagram of a Liquid-Rail-Cooled (LRC) Rack Information Handling System (RIHS) configured with LC nodes arranged in blocks and which are cooled in part by a liquid cooling system having a rail comprised of Modular Liquid Distribution (MLD) conduits, and in part by a subsystem of air-liquid heat exchangers, according to multiple embodiments.

FIG. 3 depicts an example RIHS 300 having illustrative example of LC nodes 302a-302j (collectively refer to as nodes 302), with each nodes 302a-302i having a node enclosure 304 provisioned with heat-generating components 306. RIHS 300 includes a power node 302i that is also liquid cooled. Additionally, RIHS 300 also includes an infrastructure node 302j and liquid filtration node 302k, which do not necessarily include heat-generating components 306 that require liquid cooling, as the other LC nodes 302a-302i. A Liquid-Rail Cooling (LRC) subsystem (generally shown as being within the RIHS 300 and labelled herein as 308) can be utilized for cooling the nodes 302 via an internal node-level system 309 of conduits. In the illustrative embodiments, nodes 302a-302d receive cooling liquid from a LRC subsystem 308 via block liquid manifolds (BLM) 310 that are received in a rear section of a rack 312. Additional structural features associated with the allocation of liquid flow to a BLM 310 are provided in related patent applications 15/016,226, whose content has been incorporated herein by reference.

LC nodes 302a-302d include other components 314 that are not necessarily heat generating, but which are exposed to the same ambient heat conditions as the heat-generating components 306 by virtue of their location within the node enclosure 304. In one embodiment, these other components 314 can be sufficiently cooled by the direct-interface liquid cooling applied to the node 302a-302d and/or using forced or convective air movement, as described later herein. Each node 302 is supported and protected by a respective node enclosure 304. Nodes 302a-302d are further received in node receiving bays 316 of a first block chassis 319a of a first block 320a. Nodes 302e-302h are received in a second block chassis 319b of a second block 320b. (Blocks 320a-320b are collectively referred to as blocks 320.) In the illustrative embodiments, the nodes 302 are vertically arranged. In one or more alternate embodiments, at least portions of the nodes 302 (and potentially all of the nodes) may also be arranged horizontally while benefiting from aspects of the present innovation.

LC nodes 302e-302i receive cooling liquid from the LRC subsystem 308 via liquid handling blocks 318 that are readily configurable between an open-loop and closed-loop configuration according to aspects of the present disclosure. LC nodes 302e-302h are connected to a liquid rail 324 of the RIHS 300 by a first set 326 of MLD conduits 328. LC node 302i includes a fluid mover 330 to operate in a closed-loop configuration. The liquid handling block 318 for LC node 302i is configured for intra-node recirculation by a second set 332 of MLD conduits 328.

The power node 302i has heat-generating components such as redundant AC-DC power supply modules 306a that are immersed for cooling in a dielectric liquid. The AC-DC power supply modules 306a receive AC power via a power node inlet port 334 from a power source 336. The AC-DC power supply modules 306a distributes DC power via a power node outlet port 338 over rack electrical distribution components 340 to other nodes 302a-302i, 302j-302k. The dielectric liquid is liquid cooled by cooling liquid from the LRC subsystem 308 via a liquid-to-liquid heat exchanger (LTLHE) 342. Additional features associated with power node 302i are provided in related patent applications 15/016,234, whose content has been incorporated herein by reference.

The present innovation is not limited to any specific number or configuration of nodes 302 or blocks 320a, 320b in a rack 312. According to one aspect, nodes 302 can be of different physical heights of form factors (e.g., 3U, 3.5U, 2U), and the described features can also be applied to nodes 302 having different widths and depths (into the rack), with some extensions made and/or lateral modifications to the placement of cooling subsystem conduits, as needed to accommodate the different physical dimensions. As a specific example, LC node 302i is depicted as having a larger node enclosure 304a (with corresponding different dimensions of AC-DC power supply modules 306a) of a different number of rack units in physical height (e.g., 2U) that differs from the heights (e.g., 3U) of the other nodes 302a-102h and 302j-302k. RIHS 300 can include blocks 320 or nodes 302 selectably of a range of discrete rack units. Also, different types of Information Technology (IT) components can be provided within each node 302, with each node possibly performing different functions within RIHS 300. Thus, for example, a given node 302 may include one of a server module, a power module, a control module, or a storage module. In a simplest configuration, the nodes 302 can be individual nodes operating independent of each other, with the RIHS 300 including at least one rack-level controller (RC) 342 for controlling operational conditions within the RIHS 300, such as temperature, power consumption, communication, and the like. Each node 302 is then equipped with a node-level controller (NC) 344 that communicates with the rack-level controller 342 to provide localized control of the operational conditions of the node 302. In the more standard configuration of a LRC RIHS 300, and in line with the described embodiments, RIHS 300 also includes block-level controllers (BCs) 346, communicatively coupled to the rack-level controller 342 and performing block-level control functions for the LC nodes 302 within the specific block 320. In this configuration, the nodes 302 are arranged into blocks 320, with each block 320 having one or more nodes 302 and a corresponding block-level controller 346. Note the blocks 320 do not necessarily include the same number of nodes 302, and a block 320 can include a single node 302, in some implementations.

LRC subsystem 308 provides direct-interface liquid cooling to heat-generating components 306 via a liquid rail 324 under the control of the rack-level controller 342, block-level controllers 346, and/or node-level controllers 344, in some embodiments. Rack-level controller 342 controls a supply valve 350, such as a solenoid valve, to allow cooling liquid, such as water, to be received from a facility liquid supply 352. The cooling liquid is received from facility liquid supply 352 and is passed through liquid filtration node 302k before being passed through supply conduit 354 of liquid rail 324. Each block 320a, 320b receives a dynamically controlled amount of the cooling liquid via block-level dynamic control valve 356, such as a proportional valve. Return flow from each block 346a, 346b can be protected from backflow by a respective block check valve 333. The individual needs of the respective nodes 302a-302d of block 320a can be dynamically provided by respective node-level dynamic control valves 358, controlled by the block-level controller 346, which control can, in some embodiments, be facilitated by the node-level controllers 344. In addition to allocating cooling liquid in accordance with cooling requirements (which can be optimized for considerations such as performance and economy), each of the supply valve 350 and/or dynamic control valves 356, 358 can be individually closed to mitigate a leak. A check valve 360 is provided between each node 302a-302h and 302j and a return conduit 362 of the liquid rail 324 to prevent a backflow into the nodes 302a-302h and 302j. The return conduit 362 returns the cooling liquid to a facility liquid return 364.

To support the temperature control aspects of the overall system, RIHS 300 includes temperature sensors 366 that are each located within or proximate to each node 302a-302k, with each temperature sensor 366 connected to the node-level controller 344 and/or the corresponding block-level controller 346. Temperature sensors 366 operate in a feedback control loop of the LRC subsystem 308 to control the amount of liquid flow required to cool the nodes 302a-302h and 302j. In one or more embodiments, the rack-level controller 342 can coordinate performance constraints to block-level controllers 346 and/or node-level controllers 344 that limit an amount of heat generated by the heat-generating components 306 to match a heat capacity of the flow of cooling liquid in LRC subsystem 308. Alternatively or in addition, the rack-level controller 342 can coordinate cooling levels to block-level controllers 346 and/or node-level controllers 344 that in turn control the dynamic control valves 356, 358 for absorption and transfer of the heat generated by the heat-generating components 306 by the LRC subsystem 308. In one or more embodiments, support controllers such as an LIMC 368 can perform management and operational testing of LRC subsystem 308. LIMC 368 can monitor pressure sensors 370 and liquid sensors 373 to detect a leak, to validate operation of a dynamic control valves 356, 358 or shut-off valves such as supply valve 350. LIMC 368 can perform close-loop control of specific flow rates within the RIHS 300.

Temperature monitoring controls are provided to ensure that sufficient volume and flow rate of cooling liquid are provided to properly cool any exhaust air and maintain node 302 at a desired operating temperature (or within a desired operating temperature range). In one embodiment, the temperature and volume of cooling liquid from the facility liquid supply 350 is determined based on measurements and testing and/or empirical calculations to provide adequate cooling for the operational requirements of the RIHS 300. In one or more embodiments, at least the volume of the cooling liquid is dynamically controlled to more closely approximate the cooling requirements of RIHS 300 and/or at least any air-cooled node 302j at a given time. In the illustrative embodiment, a first temperature sensor 366a is positioned to detect an air temperature of a selected one of an air intake and air exhaust of a node 302. Second temperature sensor 366b is positioned to detect an air temperature within the node 302. LIMC 368 is in communication with first and second temperature sensors 366a, 366b and with dynamic control valve 356 and LIMC 368 can dynamically adjust a volume of cooling liquid based at least in part on a difference between the detected air temperatures.

In at least one alternate embodiment, LIMC 368 is coupled to and receives the detected temperature readings from a node controller and/or a block controller that in turn is coupled to first temperature sensor 366a and second temperature sensor 366b. LIMC 368 and/or one of the other controllers generates a control signal that is sent to a pulse width modulation (PWM) circuit (not shown), which is coupled to dynamic control valve 356. In response to receipt of the control signal, PWM circuit in turn generates a PWM signal that can control the open position of dynamic control valve 356. The PWM signal adjusts the open position of dynamic control valve 356, and the open position of the valve determines (and can be used to regulate) the amount (or rate) of cooling liquid that flows through dynamic control valve 356. For rack-level valve control, LIMC 368 triggers a specific value of the PWM signal based on a rack level determination that can include consideration of available (un-allocated or reclaimed) volume of liquid flow across the RIHS 300 and other factors. Liquid handling blocks 320 can be configured as a single node liquid handling block or a block level liquid handling block supporting multiple adjacent nodes within a block chassis 319 of RIHS 300, and the flow control aspects described as being provided by LIMC 368 can also be provided by a block level controller, in one or more embodiments.

Figure 4:
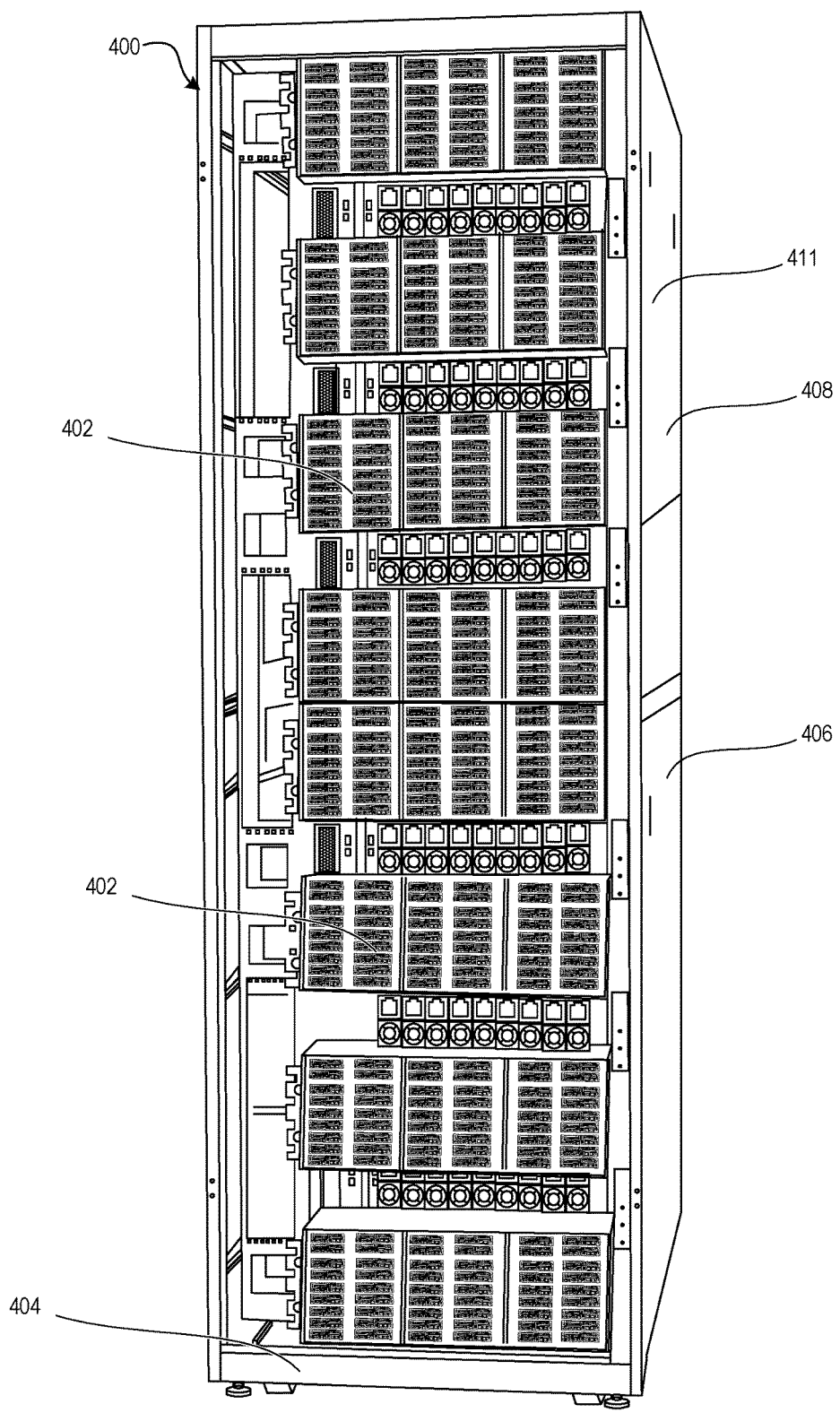
FIG. 4 illustrates a top view diagram of an example IHS including three LC nodes and a block radiator, according to one or more embodiments.
Figure 5:
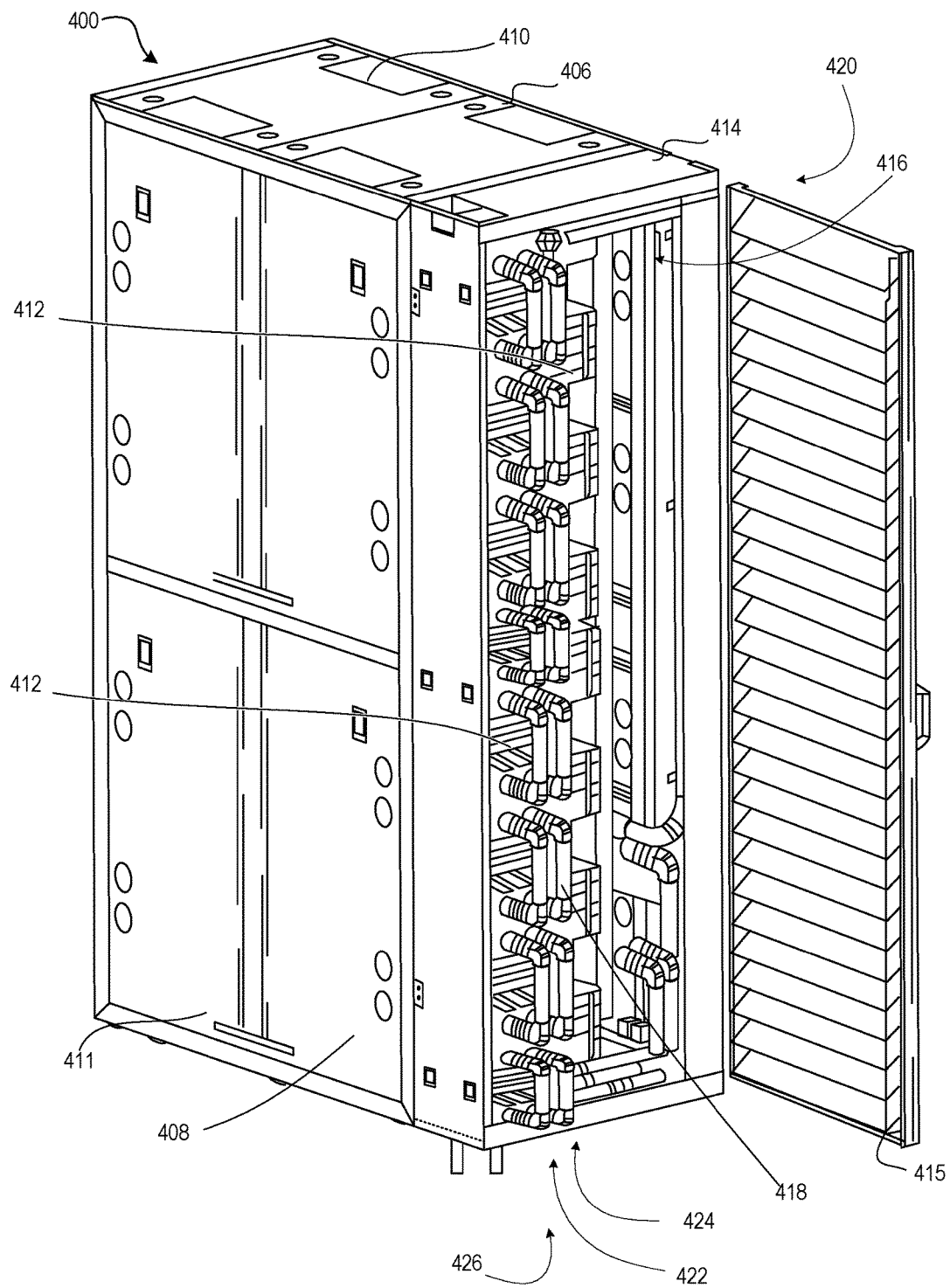
FIG. 5 illustrates a front perspective view of an example LRC RIHS having liquid-cooled nodes, according to one or more embodiments.
Figure 6:
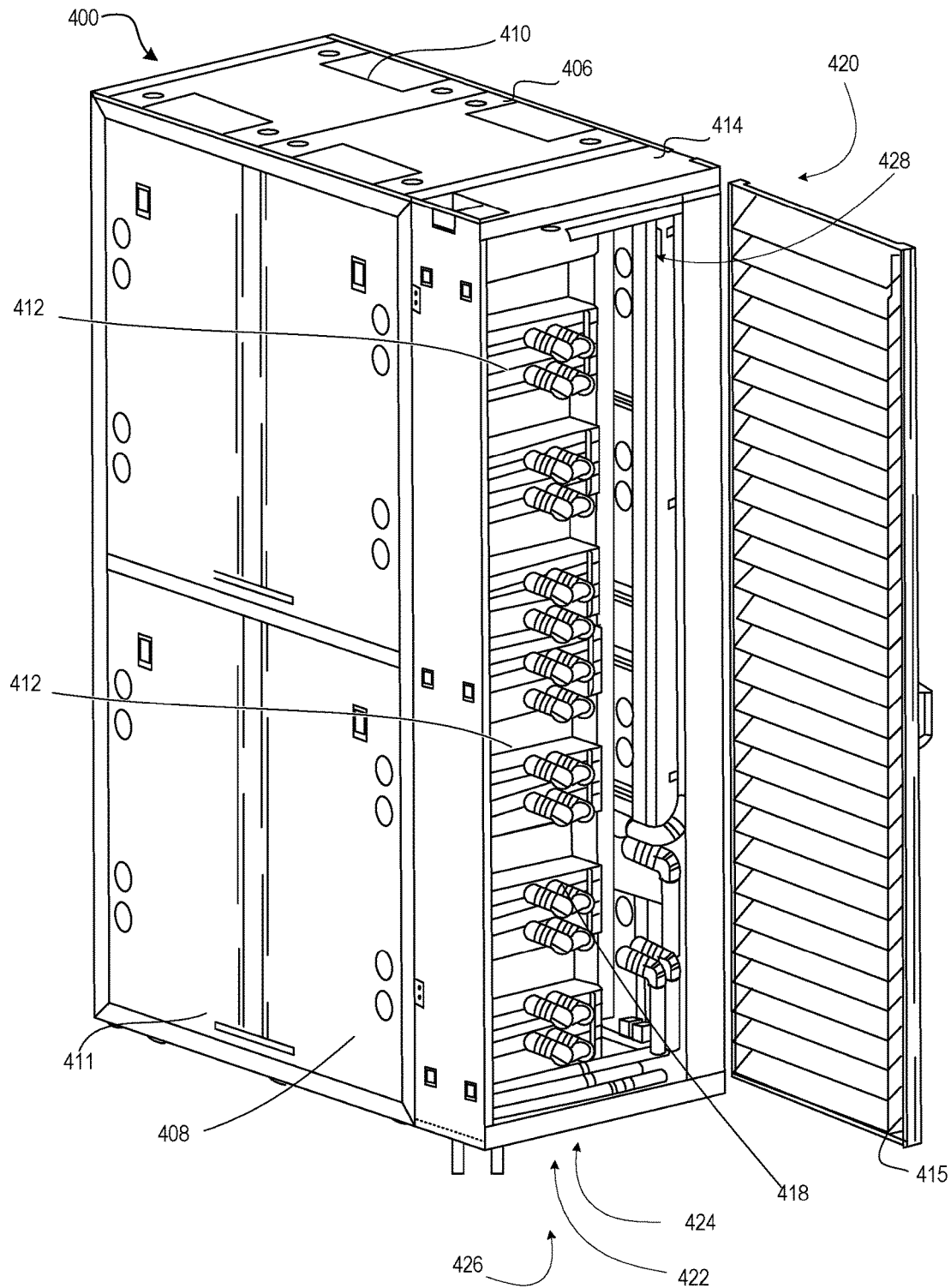
FIG. 6 illustrates a back perspective view of the example LRC RIHS of FIG. 5 having liquid-cooled nodes configured for open-loop liquid supply cooling, according to one or more embodiments.
Figure 7:
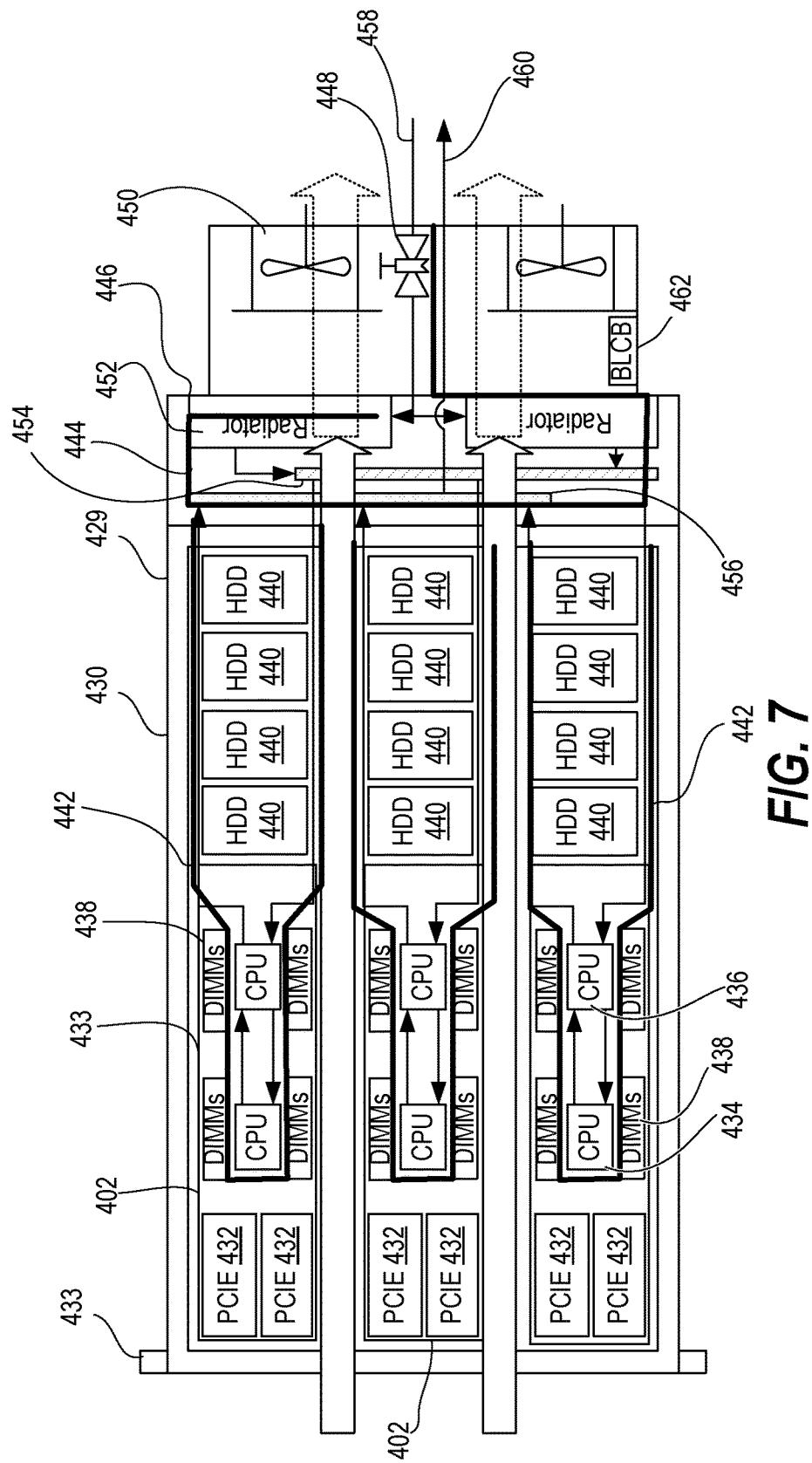
FIG. 7 illustrates a back perspective view of the example LRC RIHS of FIG. 5 having liquid-cooled nodes configured for closed-loop liquid supply cooling, according to one or more embodiments.

FIGS. 4-6 illustrate a LRC RIHS 400 that receives LC nodes 402 from a front side 404 of a rack 406 having a rack enclosure 408 formed in part by a top panel 410 (FIG. 5), side panels 411, and a bottom panel (not shown). FIGS. 5-6 illustrates block radiators 412 received in a rear section 414 of the rack enclosure 408 that is accessible via a louvered door 415. FIG. 6 illustrates a first set 416 of MLD conduits 418 of a LRC subsystem 420 configured for open loop liquid cooling. The MLD conduits 418 form a supply conduit 422 and a return conduit 424 of a liquid rail 426. FIG. 7 illustrates a second set 428 of MLD conduits 418 of the LRC subsystem 420 configured for closed loop liquid cooling. The second liquid supply for each block radiator 412 is isolated.

Figure 9:
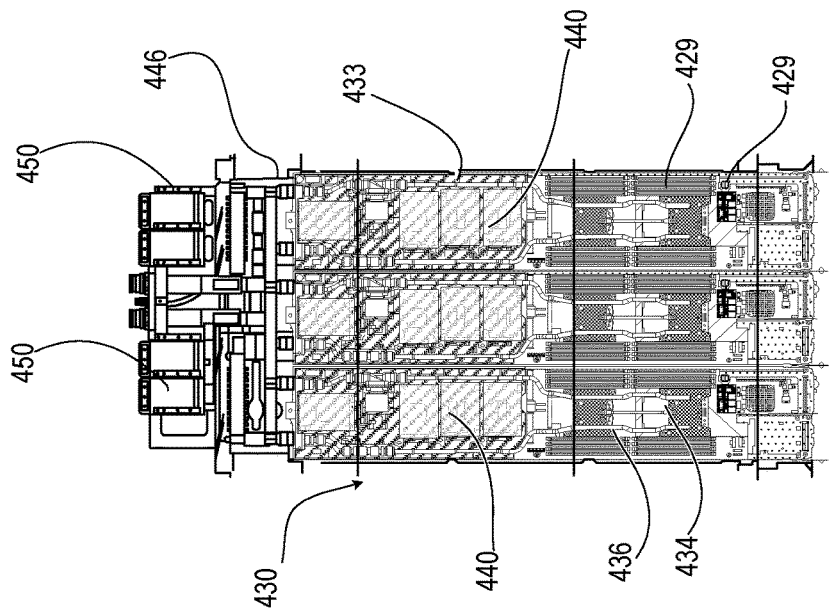
FIG. 9 illustrates a top perspective view of the example a 2U, three-by-two block of LC nodes cooled by a block radiator of FIG. 8, according to one or more embodiments.
Figure 8:
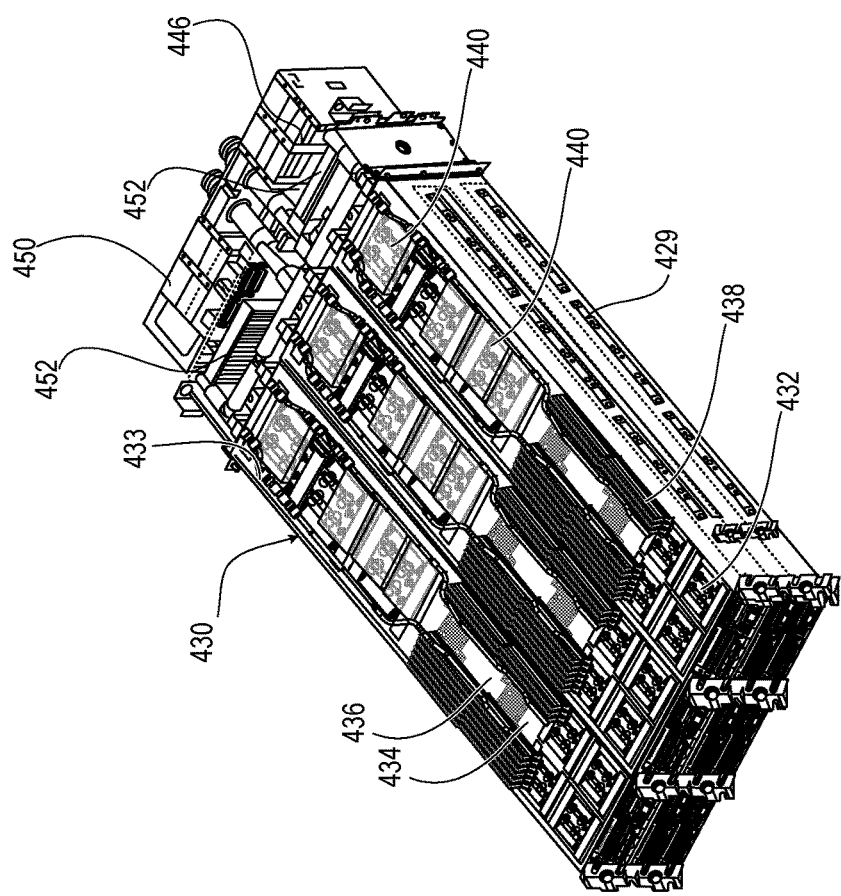
FIG. 8 illustrates a front perspective view of an example a 2U, three-by-two block of LC nodes cooled by a block radiator, according to one or more embodiments.

FIGS. 7-9 illustrates an example block 430 of three-by-four LC nodes 402 received in a block chassis 429 and cooled by the block radiator 412. With particular reference to FIG. 7, temperature and humidity sensor 431 is positioned on the block chassis 431 to detect characteristics of server inlet air. A node enclosure 433 for each node 402 is provisioned with two Personal Computer Interconnect Express (PCIE) modules 432, a primary Central Processing Unit (CPU) 434, a secondary CPU 436, Dual In-line Memory Modules (DIMMs) 438, and Hard Disk Drives (HDDs) 440. A node moisture detection wire 442 is routed around the HDDs 440 and between the DIMMs 438 and the CPUs 434, 436. A radiator moisture detection wire 444 is routed around a liquid handling block 446 including a proportional flow control valve 448. The block radiator 412 includes fan modules 450 and the liquid handling block 446. The liquid handling block 446 in turn includes LTAHEs 452 ("radiator") that receives cool liquid respectively from a first liquid plenum 454 supplied by the nodes 402 and a second liquid manifold 456 that is open loop configured as indicated by an input cooling liquid flow 458 and an output cooling liquid flow 460. A block liquid control board (BLCB) 462 performs block level liquid control functions.

Figure 10:
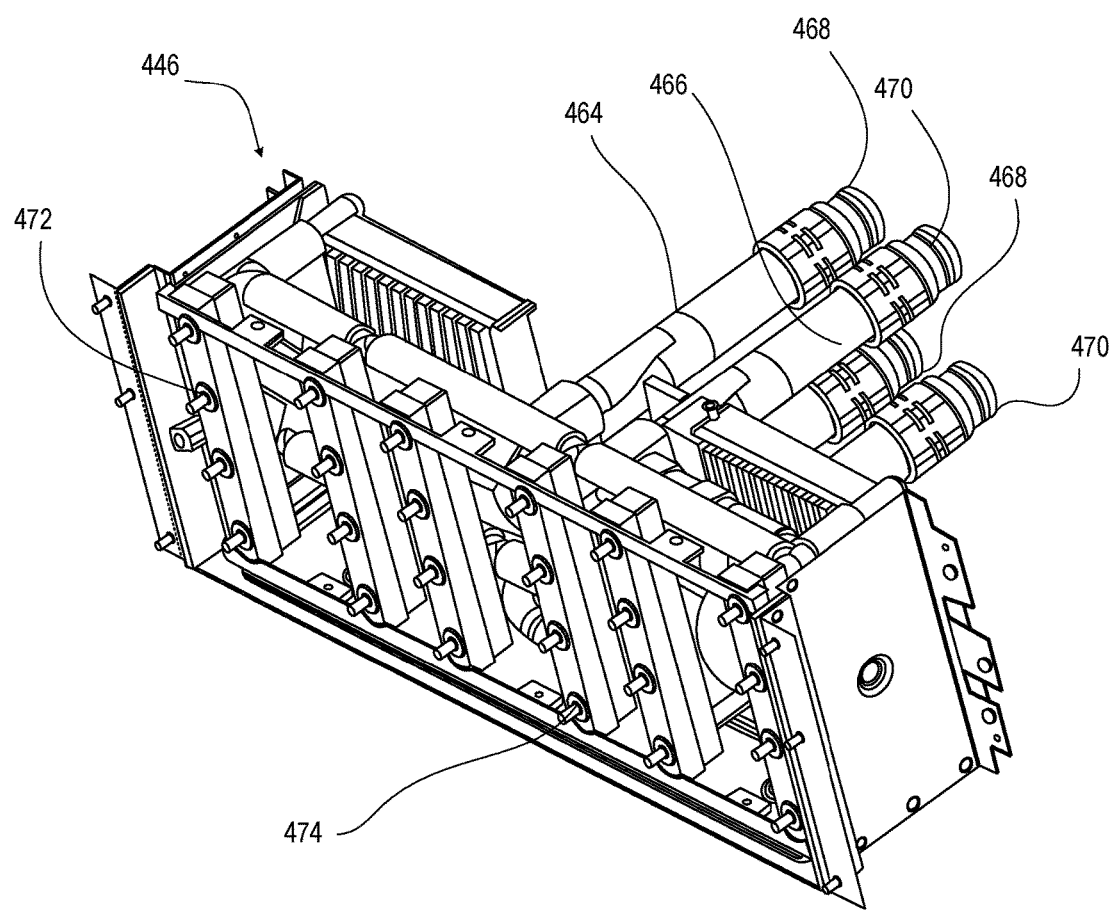
FIG. 10 illustrates a perspective view of a Liquid Handling (LH) block having the block radiator of FIG. 8, according to one or more embodiments.
Figure 11:
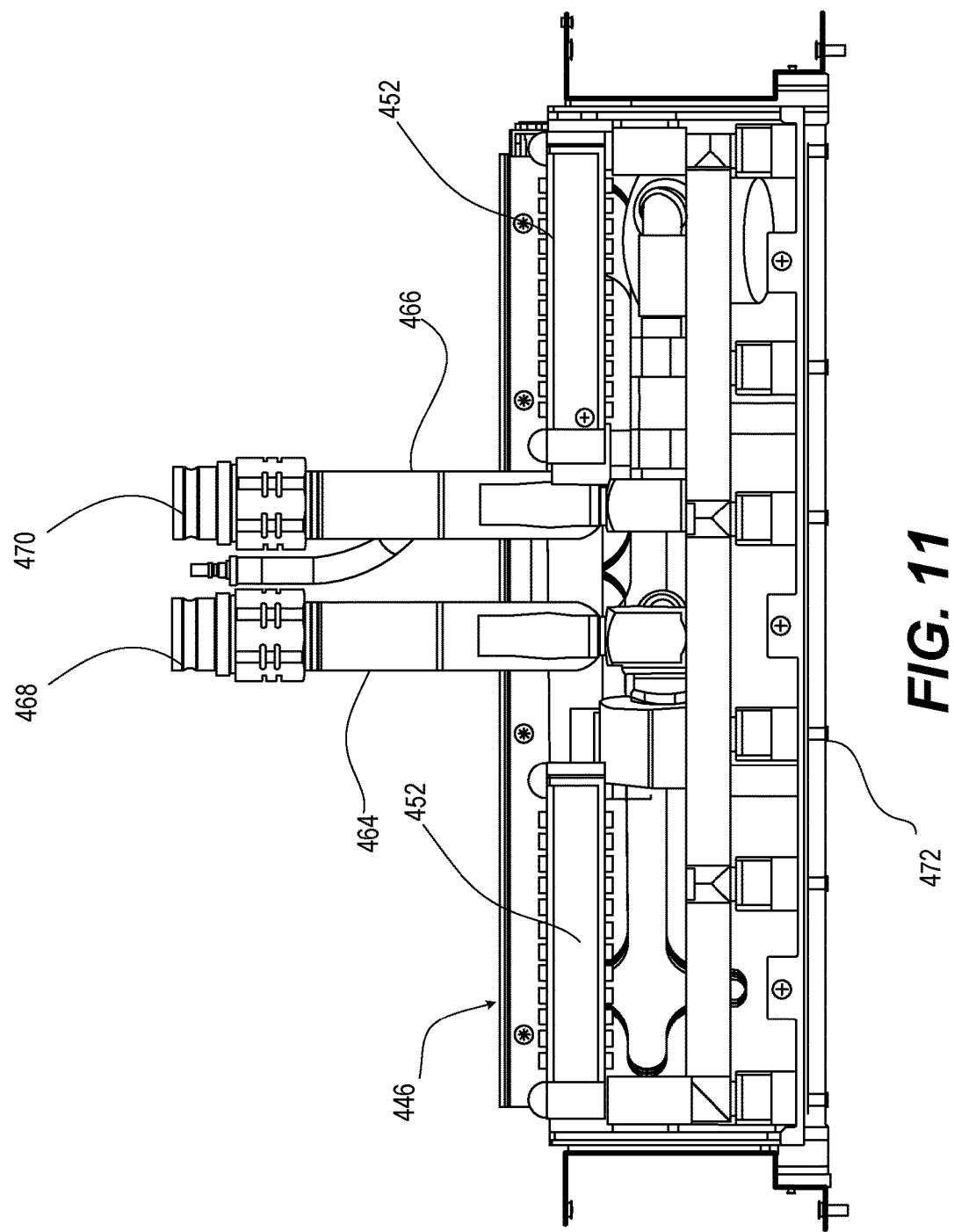
FIG. 11 illustrates a top view of the LH block of FIG. 10, according to one or more embodiments.
Figure 12:
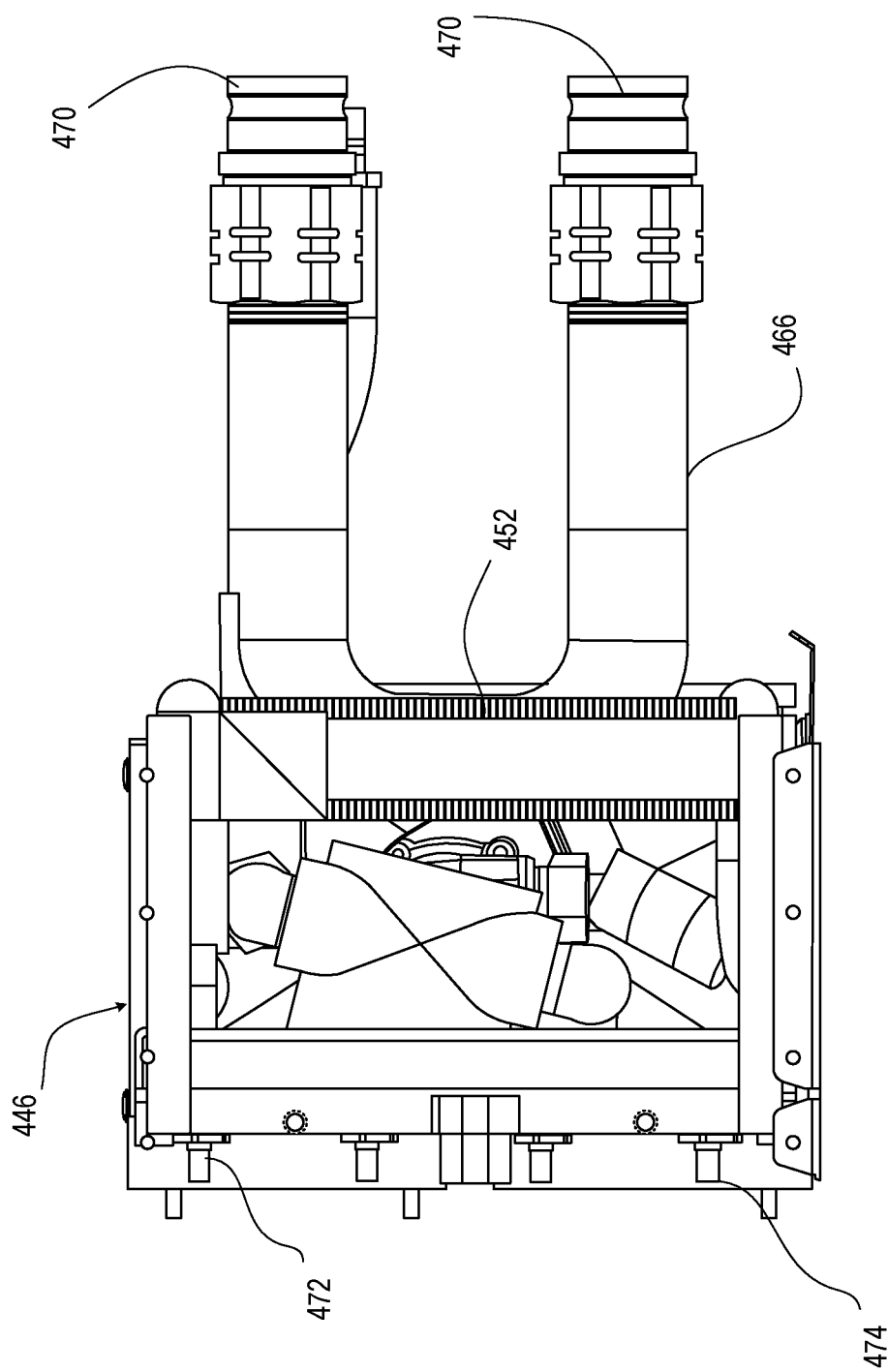
FIG. 12 illustrates a side view of the LH block of FIG. 10, according to one or more embodiments.
Figure 13:
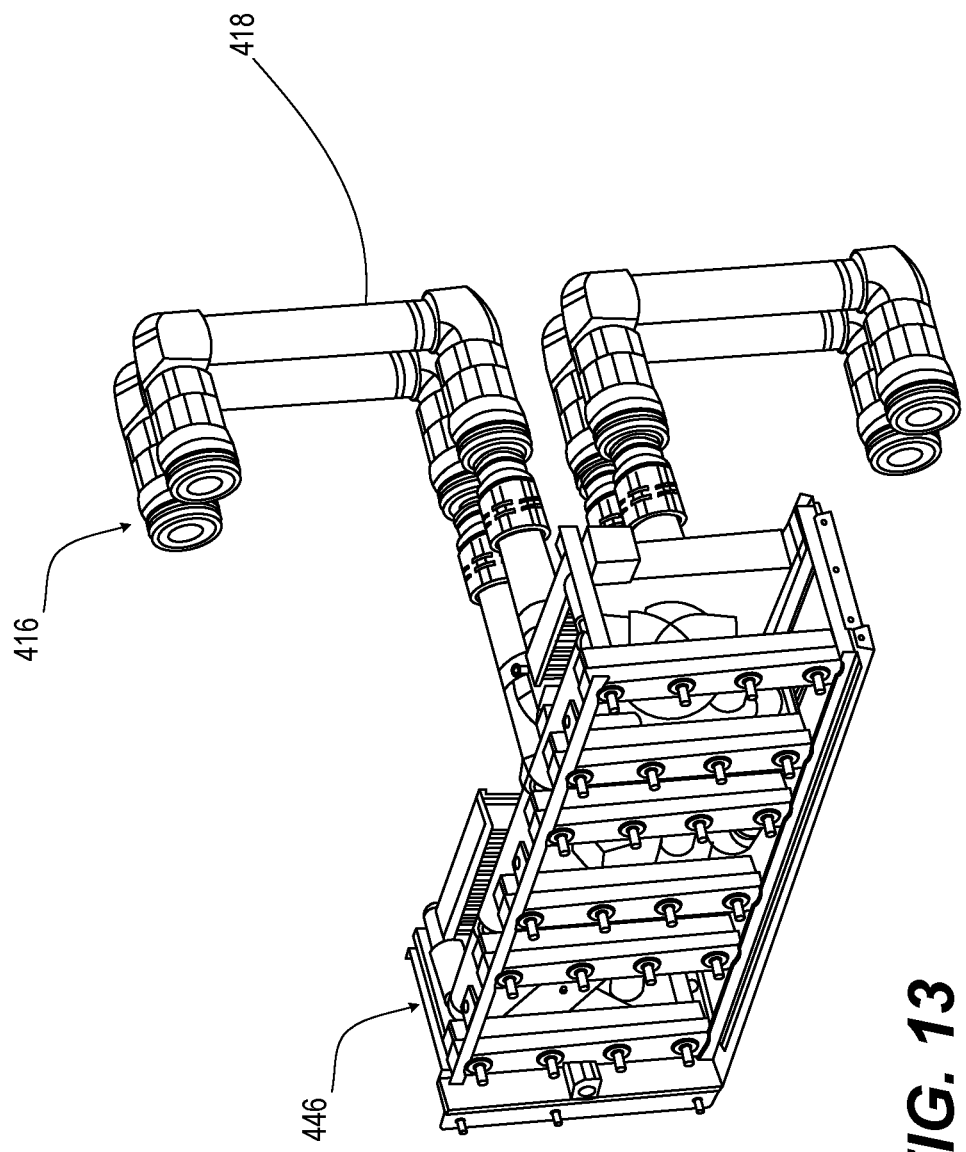
FIG. 13 illustrates a perspective view of the LH block of FIG. 10 configured for open-loop cooling liquid supply, according to one or more embodiments.
Figure 14:
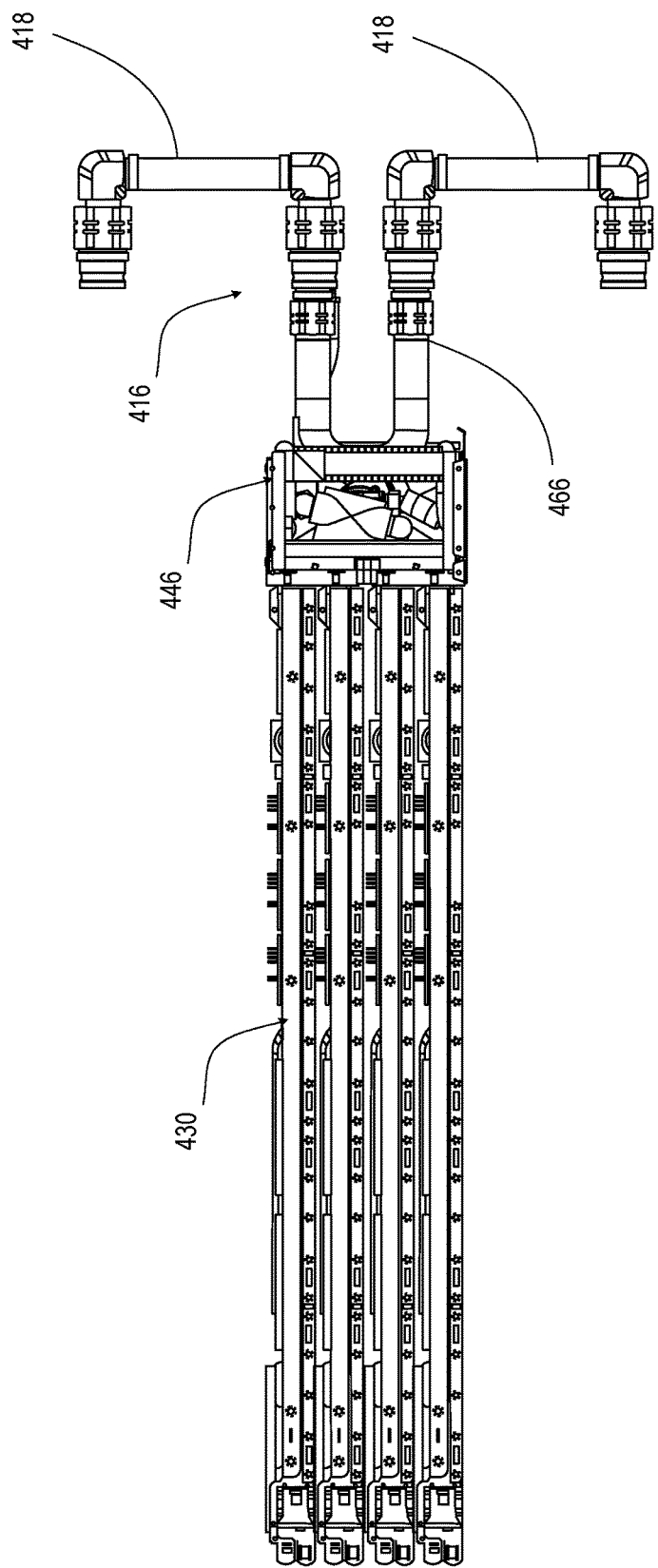
FIG. 14 illustrates a side view of the LH block of FIG. 13 configured for open-loop cooling liquid supply, according to one or more embodiments.
Figure 15:
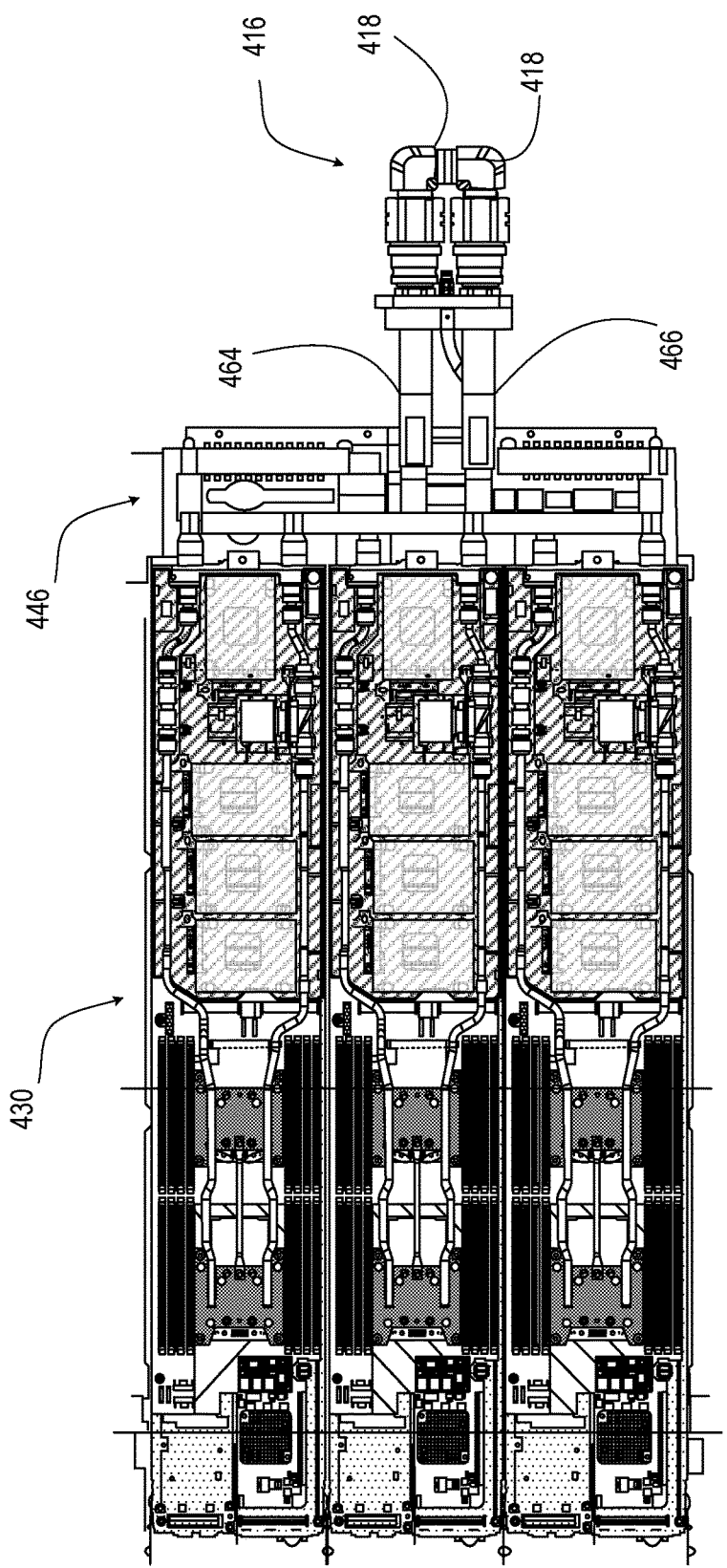
FIG. 15 illustrates a top view of the LH block of FIG. 13 configured for open-loop cooling liquid supply, according to one or more embodiments.
Figure 16:
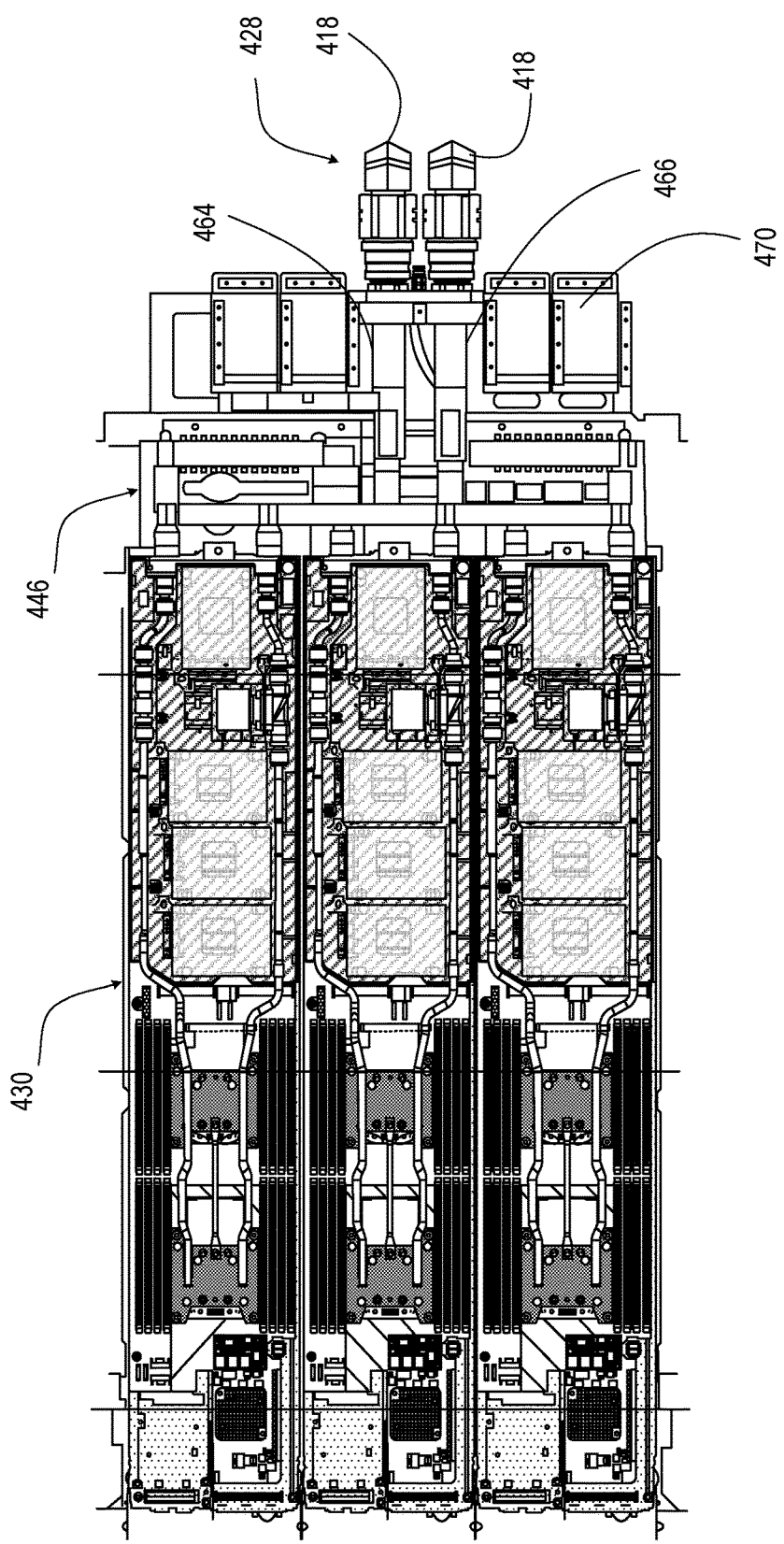
FIG. 16 illustrates a top view of the LH block of FIG. 13 configured for closed-loop cooling liquid recirculation, according to one or more embodiments.
Figure 17:
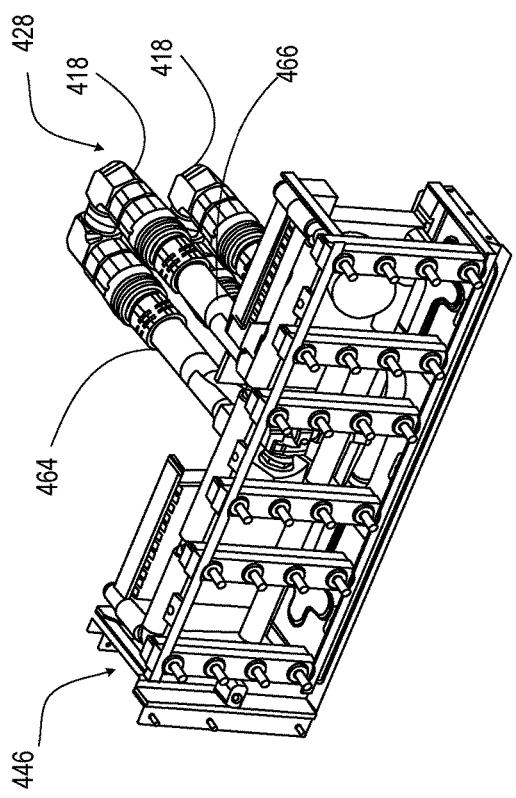
FIG. 17 illustrates a perspective view of the LH block of FIG. 16 configured for closed-loop cooling liquid recirculation, according to one or more embodiments.
Figure 18:
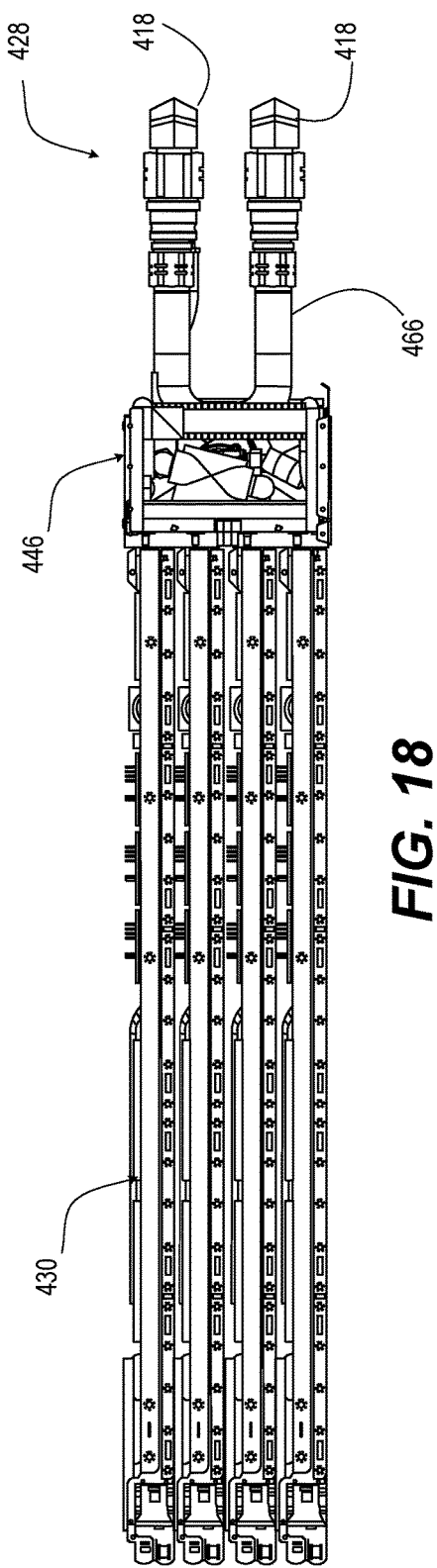
FIG. 18 illustrates a side view of the LH block of FIG. 16 configured for closed-loop cooling liquid recirculation, according to one or more embodiments.

FIGS. 10-12 illustrate the liquid handling block 446 as including supply and return bypass tubes 464, 466 that respectively terminate in pair of supply connections 468 and return connections 470. Node receiving inlet ports and outlet ports 472, 474 are presented for blind insertion for sealing engagement to the nodes 402 (FIG. 7) with quick connect and automatic shutoff. FIGS. 13-15 illustrate the first set 416 of MLD conduits 418 attached to the liquid handling block 446 in an open loop configuration. FIGS. 16-18 illustrate the second set 428 of MLD conduits 418 attached to the liquid handling block 446 in a closed loop configuration. Fan modules 470 (FIG. 16) are installed to transfer heat from the recirculated cooling liquid to the air.

Figure 19:
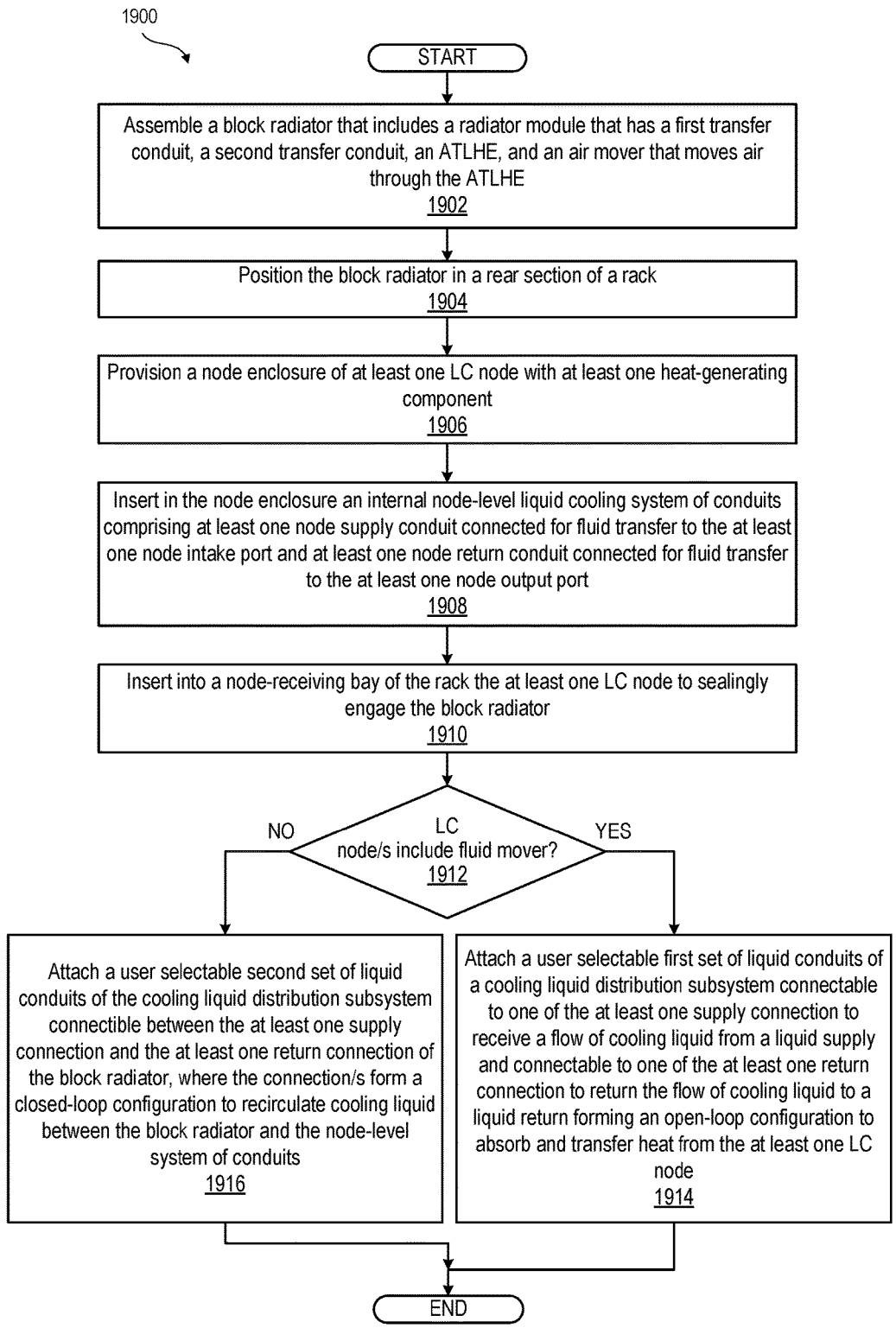
FIG. 19 illustrates a flow diagram of a method of assembling a LRC RIHS, according to one or more embodiments.

FIG. 19 illustrates a flow diagram of a method 1900 of assembling a LRC RIHS. According to one or more embodiments, the method 1900 includes assembling a block radiator that includes a liquid handling block that has a first transfer conduit, a second transfer conduit, an LTAHE, and an air mover that moves air through the LTAHE (block 1902). The method 1900 includes positioning the assembled block radiator in a rear section of a rack (block 1904). The method 1900 includes provisioning a node enclosure of at least one LC node with at least one heat-generating component (block 1906). The method 1900 includes inserting in the node enclosure an internal node-level liquid cooling system of conduits comprising at least one node supply conduit connected for fluid transfer to the at least one node intake port and at least one node return conduit connected for fluid transfer to the at least one node output port (block 1908). The method includes inserting into a node-receiving bay of the rack the at least one LC node to sealingly engage the block radiator (block 1910). The block radiator has a node-receiving intake port sealably engaged for fluid transfer to at least one node intake port of at least one LC node and having at least one supply connection. The block radiator includes a second transfer conduit having a node-receiving outlet port sealably engaged for fluid transfer to at least one node output port of the at least one LC node and having at least one return connection. the block radiator includes an LTAHE that forms a portion of the second transfer conduit The method 1900 includes determining whether the at least one LC node comprises a fluid mover connected to the node-level liquid cooling system of conduits to move the cooling liquid through the LTAHE in a closed-loop configuration (decision block 1912). In response to determining that the at least one LC node does not a comprise a fluid mover in decision block 1912, the method 1900 includes attaching a user selectable first set of liquid conduits of a cooling liquid distribution subsystem connectable to one of the at least one supply connection to receive a flow of cooling liquid from a liquid supply. The first set is also connectable to one of the at least one return connection to return the flow of cooling liquid to a liquid return forming an open-loop configuration to absorb and transfer heat from the at least one LC node (block 1914). Then method 1900 ends. In response to determining that the at least one LC node does not a comprise a fluid mover in decision block 1912, the method 1900 includes attaching a user selectable second set of liquid conduits of the cooling liquid distribution subsystem connectable between the at least one supply connection and the at least one return connection of the block radiator. The connection/s form a closed-loop configuration to recirculate cooling liquid between the block radiator and the node-level system of conduits (block 1916). Then method 1900 ends.

In the above described flow chart of FIG. 19, the methods may be embodied in an automated manufacturing system that performs a series of functional processes. In some implementations, certain steps of the method are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An Information Handling System (IHS) comprising:
at least one liquid cooled (LC) node comprising a node enclosure provisioned with at least one heat-generating component and an internal liquid cooling system of conduits comprising at least one node supply conduit connected for fluid transfer to at least one LC node intake port and at least one node return conduit connected for fluid transfer to at least one node output port;
a liquid handling (LH) block comprising:
    a first transfer conduit having at least one node-receiving intake port sealably engaged for fluid transfer to the at least one node intake port of the at least one LC node and having at least one supply connection;
    a second transfer conduit having at least one node-receiving outlet port sealably engaged for fluid transfer to the at least one node output port of the at least one LC node and having at least one return connection; and
    a radiator comprising a portion of the second transfer conduit;
a cooling liquid distribution subsystem comprising a selectable first set of liquid conduits connectable to one of the at least one supply connection to receive a flow of cooling liquid from a liquid supply and connectable to one of the at least one return connection to return the flow of cooling liquid to a liquid return forming an open-loop configuration to absorb and transfer heat from the at least one LC node; and
the cooling liquid distribution subsystem further comprising a user selectable second set of liquid conduits connectable between the at least one supply connection and the at least one return connection of the block radiator forming a closed-loop configuration to recirculate cooling liquid between the LH block and the node-level system of conduits.

2. The IHS of claim 1, further comprising:
a fluid mover connected to the liquid cooling system of conduits to move the cooling liquid through the radiator in the closed-loop configuration; and
an air mover positioned to move air through the radiator to provide a LH block assembly with the LH block for transferring heat from the cooling liquid to air passing through and exhausted by the radiator.

3. The IHS of claim 1, further comprising:
a dynamic control valve positioned to dynamically regulate liquid flow through the first transfer conduit of the LH block;
a sensor positioned to detect a temperature within the LC node; and
a liquid infrastructure management controller in communication with the sensor and the dynamic control valve to control an amount of liquid flow through the first transfer conduit in response to the temperature detected by the sensor.

4. The IHS of claim 1, further comprising a rack having at least one chassis for receiving LC nodes, wherein the LC node is inserted into a front bay of a chassis, wherein the LH block is received in a rear section of the rack.

5. The IHS of claim 4, wherein:
the first transfer conduit of the LH block comprises a supply bypass tube terminating in two supply connections and the second transfer conduit of the LH block comprises a return bypass tube terminating in two return connections; and
the IHS further comprises:
    a dynamic control valve that directs a portion of cooling liquid from the supply bypass tube to the node-receiving input port; and
    a check valve that allows forward flow only of the cooling liquid that has passed through the at least one LC node and the LH block back to the return bypass tube;
the first set of liquid conduits comprises one or more modular liquid distribution (MLD) conduits that connect for fluid transfer to the supply bypass tube of the LH block and to a selected one of a supply bypass tube corresponding to an adjacent node and a facility supply; and
the return conduit comprises one or more MLD conduits that connect for fluid transfer to a return bypass tube of the node and a selected one of a return bypass tube corresponding to the adjacent node and a facility return.

6. The IHS of claim 5, further comprising one or more LC nodes each having a supply bypass tube and a return bypass tube connected to any adjacent node by MLD conduits to form a liquid rail.

7. A liquid handling (LH) block for use in a liquid cooled rack information handling system (RIHS) having at least one liquid-cooled node with heat generating components, the block radiator comprising:
a first transfer conduit having a node-receiving intake port that enables sealable engagement for fluid transfer to at least one node intake port of at least one liquid cooled (LC) node and having at least one supply connection;
a second transfer conduit having a node-receiving outlet port that enables sealable engagement for fluid transfer to at least one node output port of the at least one LC node and having at least one return connection; and
a radiator comprising a portion of the second transfer conduit;
wherein the LH block is designed for connection between the at least one LC cooled node and a cooling liquid distribution subsystem having: (i) a selectable first set of liquid conduits connectable to one of the at least one supply connection to receive a flow of cooling liquid from a liquid supply and connectable to one of the at least one return connection to return the flow of cooling liquid to a liquid return forming an open-loop configuration to absorb and transfer heat from the at least one LC node; and (ii) a selectable second set of liquid conduits connectable between the at least one supply connection and the at least one return connection of the block radiator forming a closed-loop configuration to recirculate cooling liquid between the block radiator and the node-level system of conduits.

8. The LH block of claim 7, wherein:
the at least one LC node comprises a node enclosure provisioned with at least one heat-generating component and an internal node-level liquid cooling system of conduits comprising at least one node supply conduit connected for fluid transfer to the at least one node intake port and at least one node return conduit connected for fluid transfer to the at least one node output port;

the at least one LC nodes comprises a fluid mover connected to the node-level liquid cooling system of conduits to move the cooling liquid through the radiator in the closed-loop configuration; and the LH block further comprises an air mover positioned to move air through the radiator to form an LH block assembly with the LH block for transferring heat from the cooling liquid to air exhausted by the radiator.

9. The LH block of claim 7, further comprising a dynamic control valve positioned to dynamically regulate liquid flow through the first transfer conduit of the LH block, wherein:

a sensor is positioned to detect a temperature within the LC node; and a liquid infrastructure management controller is in communication with the sensor and the dynamic control valve to control an amount of liquid flow in response to the temperature detected by the sensor.

10. The LH block of claim 7, wherein:

the LH block is received in a rear section of a rack having one or more chassis for receiving LC nodes; and the LH block sealingly engages for fluid transfer at the least one LC node inserted into a front bay of a chassis.

11. The LH block of claim 10, wherein:

the first transfer conduit of the LH block comprises a supply bypass tube terminating in two supply connections and the second transfer conduit of the LH block comprises a return bypass tube terminating in two return connections;

the LH block further comprises:

a dynamic control valve that directs a portion of cooling liquid from the supply bypass tube to the node-receiving input port;

a check valve that allows forward flow only of the cooling liquid that has absorbed heat from the heat generating component back to return bypass tube;

the first set of conduits comprises one or more modular liquid distribution (MLD) conduits that connect for fluid transfer to the supply bypass tube of the LH block and to a selected one of a supply bypass tube corresponding to an adjacent node and a facility supply; and the return conduit comprises one or more MLD conduits that connect for fluid transfer to return bypass tube of the node and a selected one of a return bypass tube corresponding to the adjacent node and a facility return.

12. The LH block of claim 11, further comprising one or more LC nodes each having a supply bypass tube and a return bypass tube connected to any adjacent node by MLD conduits to form a liquid rail.

13. A method of assembling an Information Handling System (IHS), the method comprising:

positioning a liquid handling (LH) block in a rear section of a rack, wherein the LH block comprises:

a first transfer conduit having a node-receiving intake port sealably engaged for fluid transfer to at least one node intake port of at least one liquid cooled (LC) node and having at least one supply connection;

a second transfer conduit having a node-receiving outlet port sealably engaged for fluid transfer to at least one node output port of the at least one LC node and having at least one return connection; and radiator comprising a portion of the second transfer conduit;

inserting into a node-receiving bay of the rack at least one LC node comprising a node enclosure provisioned with at least one heat-generating component and an internal node-level liquid cooling system of conduits comprising at least one node supply conduit connected for fluid transfer to the at least one node intake port and at least one node return conduit connected for fluid transfer to the at least one node output port;

determining whether the at least one LC node comprises a fluid mover connected to the node-level liquid cooling system of conduits to move the cooling liquid through the radiator in a closed-loop configuration;

in response to determining that the at least one LC node does not comprise a fluid mover, attaching a user selectable first set of liquid conduits of a cooling liquid distribution subsystem connectable to one of the at least one supply connection to receive a flow of cooling liquid from a liquid supply and connectable to one of the at least one return connection to return the flow of cooling liquid to a liquid return forming an open-loop configuration to absorb and transfer heat from the at least one LC node; and in response to determining that the at least one LC node does comprise a fluid mover, attaching a user selectable second set of liquid conduits of the cooling liquid distribution subsystem connectable between the at least one supply connection and the at least one return connection of the block radiator forming a closed-loop configuration to recirculate cooling liquid between the block radiator and the node-level system of conduits.

14. The method of claim 13, further comprising, in response to determining that the at least one LC node does comprise a fluid mover, positioning an air mover to move air through the LTAHE to form an LH block assembly with the LH block for transferring heat from the cooling liquid to air exhausted by the radiator.

15. The method of claim 13, further comprising:

positioning a sensor to detect a temperature within the LC node; and connecting for electronic communication a liquid infrastructure management controller with the sensor and a dynamic control valve positioned to dynamically regulate liquid flow through the first transfer conduit of the LH block to enable control of an amount of liquid flow in response to the temperature detected by the sensor.

16. The method of claim 13, wherein:

the first transfer conduit of the LH block comprises a supply bypass tube terminating in two supply connections and the second transfer conduit of the LH block comprises a return bypass tube terminating in two return connections;

a dynamic control valve that directs a portion of cooling liquid from the supply bypass tube to the node-receiving input port;

a check valve that allows forward flow only of the cooling liquid that has absorbed heat from the heat generating component from the at least one LC node and the LH block back to return bypass tube;

the first set of conduits comprises one or more modular liquid distribution (MLD) conduits that connect for fluid transfer to the supply bypass tube of the LH block and to a selected one of a supply bypass tube corresponding to an adjacent node and a facility supply; and the return conduit comprises one or more MLD conduits that connect for fluid transfer to return bypass tube of the node and a selected one of a return bypass tube corresponding to the adjacent node and a facility return.

17. The method of claim 16, wherein the IHS further comprises one or more LC nodes each having a supply bypass tube and a return bypass tube connected to any adjacent node by MLD conduits to form a liquid rail.

* * * * *